(12) United States Patent
Jin et al.

(10) Patent No.: US 11,342,368 B2
(45) Date of Patent: *May 24, 2022

(54) IMAGE SENSORS FOR DISTANCE MEASUREMENT

(71) Applicant: Samsung Electronics Co., Ltd., Suwon-si (KR)

(72) Inventors: Young-gu Jin, Suwon-si (KR); Young-chan Kim, Seongnam-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/096,210

(22) Filed: Nov. 12, 2020

(65) Prior Publication Data
US 2021/0066367 A1 Mar. 4, 2021

Related U.S. Application Data

(63) Continuation of application No. 16/519,653, filed on Jul. 23, 2019, now Pat. No. 10,868,059.

(30) Foreign Application Priority Data

Dec. 6, 2018 (KR) .................. KR10-2018-0156276

(51) Int. Cl.
*H01L 27/146* (2006.01)
*G01S 17/08* (2006.01)
(Continued)

(52) U.S. Cl.
CPC ...... *H01L 27/14614* (2013.01); *G01S 7/4816* (2013.01); *G01S 17/08* (2013.01);
(Continued)

(58) Field of Classification Search
CPC ........... H01L 27/14614; H01L 27/1461; H01L 27/14645; H01L 27/14603;
(Continued)

(56) References Cited

U.S. PATENT DOCUMENTS 7,153,719 B2 12/2006 Patrick et al.
7,626,685 B2 * 12/2009 Jin .......................... G01C 3/08
257/290

(Continued)

*Primary Examiner* — Vu A Vu
(74) *Attorney, Agent, or Firm* — Harness, Dickey & Pierce, P.L.C.

(57) ABSTRACT

An image sensor includes a semiconductor substrate including a first surface and a second surface and further includes a well region and a first floating diffusion region that are each adjacent to the first surface. The image sensor includes a first vertical transmission gate and a second vertical transmission gate isolated from direct contact with each other and each extend from the first surface of the semiconductor substrate and in a thickness direction of the semiconductor substrate through at least a portion of the well region. The image sensor includes a first storage gate between the first vertical transmission gate and the first floating diffusion region and on the first surface of the semiconductor substrate. The image sensor includes a first tap transmission gate between the first storage gate and the first floating diffusion region and on the first surface of the semiconductor substrate.

20 Claims, 25 Drawing Sheets

(51) Int. Cl.
  *G01S 7/481* (2006.01)
  *G11C 11/56* (2006.01)
  *G01S 7/4914* (2020.01)

(52) U.S. Cl.
  CPC ...... *G11C 11/5607* (2013.01); *H01L 27/1461* (2013.01); *G01S 7/4914* (2013.01); *H01L 27/14645* (2013.01)

(58) Field of Classification Search
  CPC ......... H01L 27/14625; H01L 27/14609; H01L 27/14627; H01L 27/14636; G01S 17/08; G01S 7/4816; G01S 7/4914; G01S 17/894; G01S 7/4863; G11C 11/5607
  USPC ........................................................ 257/459
  See application file for complete search history.

(56) References Cited

U.S. PATENT DOCUMENTS

| | | | |
|---|---|---|---|
| 9,324,753 B2 | 4/2016 | Kato et al. | |
| 9,356,061 B2 | 5/2016 | Fan et al. | |
| 9,356,067 B2 | 5/2016 | Shin | |
| 9,859,311 B1 | 1/2018 | Manabe et al. | |
| 9,860,518 B2 | 1/2018 | Kautzsch | |
| 9,952,324 B2 | 4/2018 | Popp | |
| 10,868,059 B2 * | 12/2020 | Jin | H01L 27/14603 |
| 2014/0225173 A1 | 8/2014 | Kim et al. | |
| 2018/0106892 A1 | 4/2018 | Parascandola et al. | |
| 2018/0366504 A1 | 12/2018 | Jin | |

* cited by examiner

IMAGE SENSORS FOR DISTANCE MEASUREMENT

CROSS-REFERENCE TO RELATED APPLICATIONS

This application is a continuation of U.S. application Ser. No. 16/519,653, filed on Jul. 23, 2019, which claims the benefit of Korean Patent Application No. 10-2018-0156276, filed on Dec. 6, 2018, in the Korean Intellectual Property Office, the disclosure of each of which is incorporated herein in its entirety by reference.

BACKGROUND

The inventive concepts relates to image sensors, and more particularly, to image sensors for distance measurement.

Time-of-flight (ToF)-based image sensors may measure information about a distance from said image sensors to a subject to generate a three-dimensional (3D) image of the subject. ToF-based image sensors may irradiate light onto a subject, and then, may measure the ToF taken until light reflected from the subject is received, thereby obtaining information about a distance.

SUMMARY

The inventive concepts provide an image sensor for distance measurement, which enables a pixel to be miniaturized and reduces read noise.

According to some example embodiments, an image sensor may include a semiconductor substrate including a first surface and a second surface. The semiconductor substrate may further include a well region and a first floating diffusion region. Each of the well region and the first floating diffusion may be adjacent to the first surface. The image sensor may include a first vertical transmission gate and a second vertical transmission gate isolated from direct contact with each other. The first vertical transmission gate and the second vertical transmission gate may each extend from the first surface of the semiconductor substrate and in a thickness direction of the semiconductor substrate through at least a portion of the well region. The thickness direction may be perpendicular to at least one of the first surface and the second surface. The image sensor may include a first storage gate between the first vertical transmission gate and the first floating diffusion region. The first storage gate may be on the first surface of the semiconductor substrate. The image sensor may include a first tap transmission gate between the first storage gate and the first floating diffusion region. The first tap transmission gate may be on the first surface of the semiconductor substrate.

According to some example embodiments, an image sensor may include a semiconductor substrate including a first surface and a second surface. The semiconductor substrate may further include a demodulation region. The image sensor may include a first vertical transmission gate and a second vertical transmission gate isolated from direct contact with each other. The demodulation region may be between the first vertical transmission gate and the second vertical transmission gate. The first vertical transmission gate and the second vertical transmission gate may each extend in a thickness direction of the semiconductor substrate from the first surface of the semiconductor substrate. The thickness direction may be perpendicular to at least one of the first surface and the second surface. The image sensor may include a first storage gate and a second storage gate on the first surface of the semiconductor substrate. The first storage gate may be adjacent to the first vertical transmission gate. The second storage gate may be adjacent to the second vertical transmission gate. The image sensor may include a first tap transmission gate and a second tap transmission gate on the first surface of the semiconductor substrate. The first tap transmission gate may be adjacent to the first storage gate. The second tap transmission gate may be adjacent to the second storage gate.

According to some example embodiments, an image sensor may include a semiconductor substrate including a first surface and a second surface. The semiconductor substrate may further include a demodulation region and a first floating diffusion region. The semiconductor substrate may be associated with a first conductivity type. The image sensor may include a first vertical transmission gate and a second vertical transmission gate isolated from direct contact with each other. The demodulation region may be between the first vertical transmission gate and the second vertical transmission gate. The first vertical transmission gate and the second vertical transmission gate may each extend in a thickness direction of the semiconductor substrate from the first surface of the semiconductor substrate. The thickness direction may be perpendicular to at least one of the first surface and the second surface. The image sensor may include a first storage gate between the first vertical transmission gate and the first floating diffusion region. The first storage gate may be on the first surface of the semiconductor substrate. The image sensor may include a first tap transmission gate between the first storage gate and the first floating diffusion region. The first tap transmission gate may be on the first surface of the semiconductor substrate. The image sensor may include a storage diffusion region in an inner portion of the semiconductor substrate. The storage diffusion region may be on the first storage gate. The storage diffusion region may be associated with a second conductivity type. The second conductivity type may be different from the first conductivity type.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
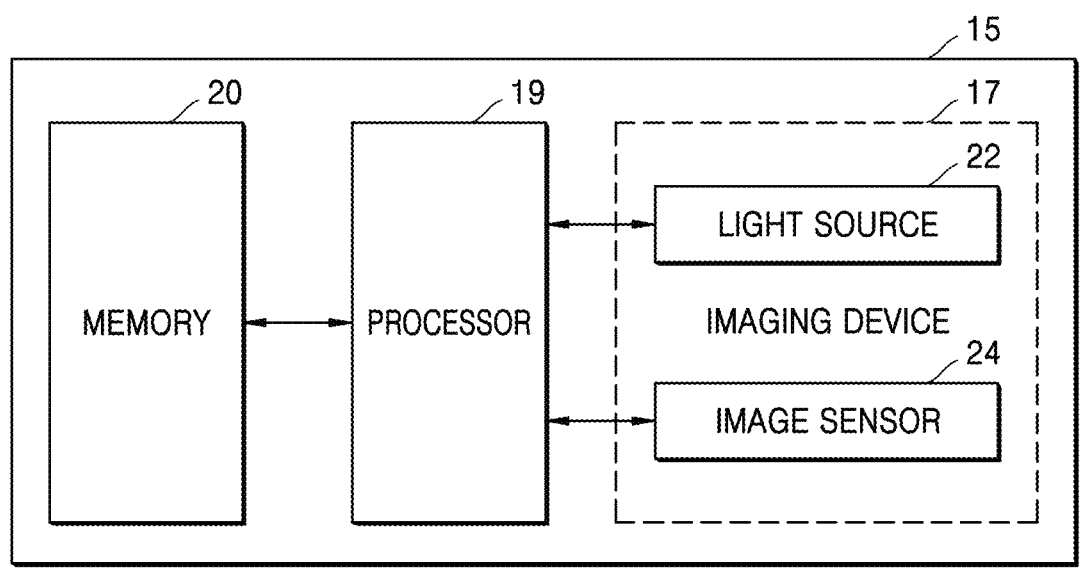
FIG. 1 is a block diagram of a system according to some example embodiments.

Hereinafter, example embodiments will be described in detail with reference to the accompanying drawings. Herein, like reference numerals refer to like elements, and their repetitive descriptions will be omitted.

FIG. 1 is a block diagram of a system 15 according to some example embodiments.

Referring to FIG. 1, the system 15 may include an imaging device 17, which is connected to a processor 19 or a host to communicate with the processor 19 or the host. The system 15 may further include a memory 20, which is connected to the processor 19 and stores information such as image data received from the imaging device 17. In some example embodiments, the system 15 may be integrated into one semiconductor chip. In other embodiments, each of the imaging device 17, the processor 19, and the memory 20 may be implemented as a separate semiconductor chip. In some embodiments, the memory 20 may include one or more memory chips. In some embodiments, the processor 19 may include multi-processing chips.

The system 15 may be a low power electronic device for an application of an image sensor for distance measurement. The system 15 may be a portable type or a stationary type. Examples of the portable type of the system 15 may include mobile devices, cellular phones, smartphones, user equipment (UE), tablet personal computers (PCs), digital cameras, laptop or desktop computers, electronic smartwatches, machine-to-machine (M2M) communication devices, virtual reality (VR) devices or modules, robots, etc. Examples of the stationary type of the system 15 may include game consoles of video game arcades, interactive video terminals, vehicles, machine vision systems, industrial robots, VR devices, cameras mounted on a driver side in vehicles, etc.

In some embodiments, the imaging device 17 may include a light source 22 and an image sensor 24. The light source 22 may include, for example, a laser diode (LD) or a light-emitting diode (LED) which each emits infrared (IR) light or visible light, a near-infrared (NIR) laser, a point light source, a white lamp, a monochromatic illumination source configured by a combination of a white lamp and a monochromator, or a combination of other laser sources. In some embodiments, the light source 22 may emit IR light having a wavelength of about 800 nm to about 1,000 nm. The image sensor 24 may include a pixel array and auxiliary processing circuits each described below and illustrated in FIG. 2.

For example, the processor 19 may be a central processing unit (CPU) which is a general-purpose processor. Herein, for convenience of description, a CPU may be referred to as a processor. In some embodiments, the processor 19 may further include a microcontroller, a digital signal processor (DSP), a graphics processing unit (GPU), and an application specific integrated circuit (ASIC) processor, in addition to the CPU. Also, the processor 19 may include one or more CPUs which operate in a distributed processing environment. For example, the processor 19 may be a system on chip (SoC) having additional functions, in addition to a function of the CPU.

The memory 20 may include, for example, dynamic random access memory (DRAM) such as synchronous DRAM (SDRAM), a high bandwidth memory (HBM) module, or a DRAM-based three-dimensional stack (3DS) module such as a hybrid memory cube (HMC) memory. The memory 20 may include, for example, a solid state drive (SSD), a DRAM module, or a semiconductor-based storage such as static random access memory (SRAM), phase change random access memory (PRAM), resistive random access memory (RRAM), conductive bridging random access memory (CBRAM), magnetic random access memory (MRAM), or spin-transfer torque MRAM (STT-MRAM).

Figure 2:
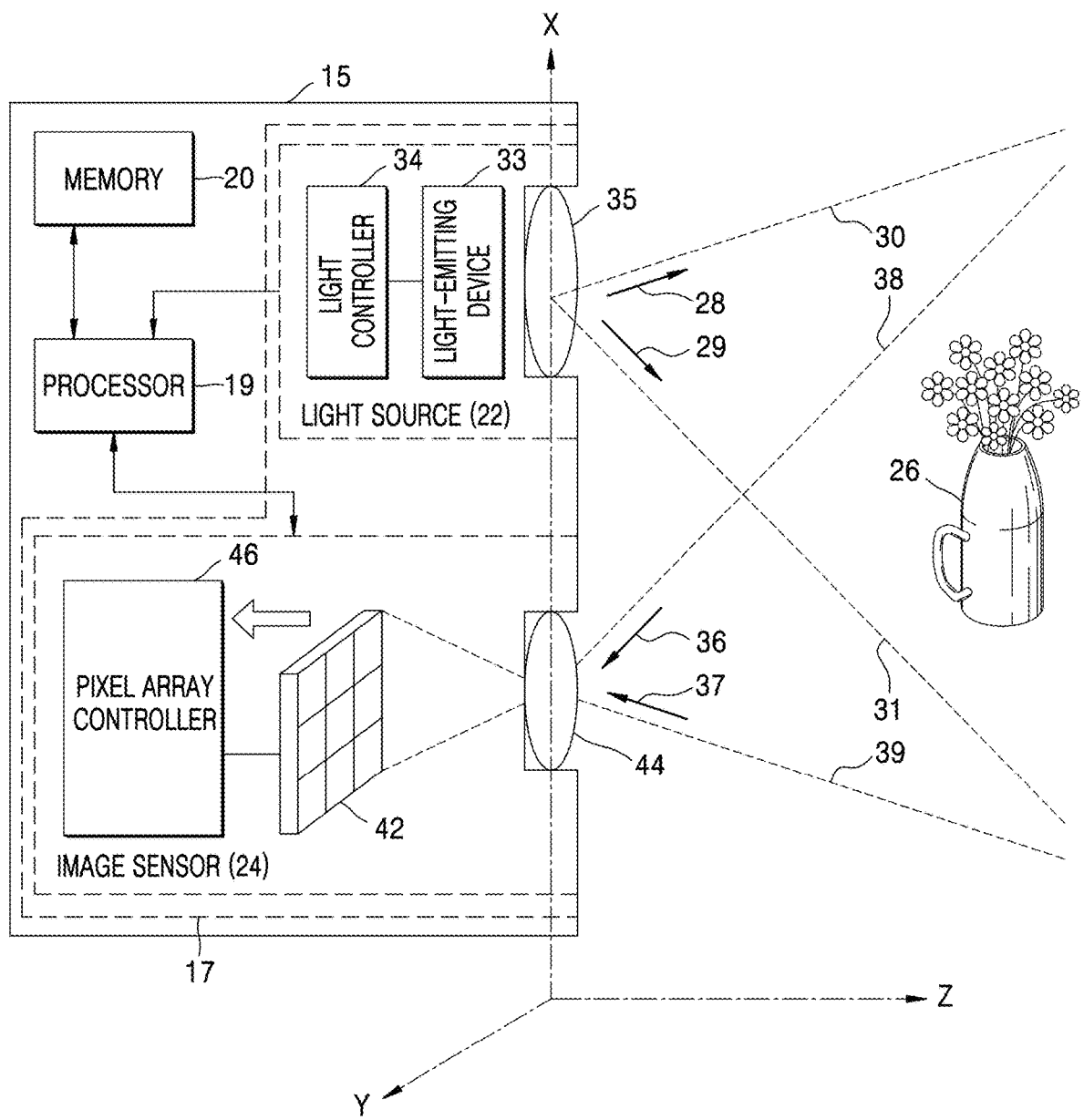
FIG. 2 is a block diagram for describing an operation of a system according to some example embodiments.

FIG. 2 is a block diagram for describing an operation of the system 15 according to some example embodiments.

Referring to FIG. 2, the system 15 may be used to obtain Z-axis depth information about a three-dimensional (3D) object 26 which may be an individual object or an object in a scene (not shown). In some embodiments, the depth information may be calculated by the processor 19, based on scan data received from the image sensor 24, or may be autonomously calculated by the image sensor 24. In some embodiments, the depth information may be used as a portion of a 3D user interface by the processor 19 and may enable a user of the system 15 to interact with a 3D image of the 3D object 26 or use the 3D image of the 3D object 26 as a portion of another application executed by the system 15.

An X axis may be a horizontal direction corresponding to a front region in front of the system 15, a Y axis may be a vertical direction deviating from a page, and the Z axis may extend in a direction from the system 15 to the 3D object 26.

An optical axis of the light source 22 and an optical axis of the image sensor 24 may be parallel to the Z axis, for depth measurement.

The light source 22 may illuminate the 3D object 26 as illustrated by arrows 28 and 29. The arrows 28 and 29 may respectively correspond to dashed lines 30 and 31 representing a path of an optical beam or an optical emission. The optical beam or the optical emission may be used to point-scan the 3D object 26 within an optical viewing angle. Line-unit scan performed on an object surface may be performed by an optical emission source which may be a light-emitting device 33 operated and controlled by a light controller 34. An optical beam from the light-emitting device 33 may be point-scanned in an X-Y direction over a surface of the 3D object 26 through a projection lens 35, based on control by the light controller 34. In some embodiments, a point-scan operation may project light spots onto a surface of a 3D object along a scan line. The projection lens 35 may be a cylindrical optical device which concentrates a laser beam, irradiated from a concentration lens or the light-emitting device 33, on one spot of a surface of the 3D object 26. For example, the projection lens 35 may be a concentration lens having a convex structure, but is not limited thereto. An appropriate lens design of another type may be selected for the projection lens 35. The 3D object 26 may be disposed at a focal position at which light irradiated from the light-emitting device 33 is concentrated on a light spot by the projection lens 35. Therefore, in the point-scan operation, a spot or a narrow region of the surface of the 3D object 26 may be sequentially illuminated by an optical beam concentrated from the projection lens 35.

In some embodiments, the light-emitting device 33 may include an LD or an LED which each emits IR light or visible light, an NIR laser, a point light source, a white lamp, a monochromatic illumination source configured by a combination of a white lamp and a monochromator, or a combination of other laser sources. The light-emitting device 33 may be fixed at a position of a housing of the system 15 and may rotate in the X-Y direction. The light-emitting device 33 may be controlled in the X-Y direction by the light controller 34 and may perform a point-scan operation on the 3D object 26. In some embodiments, visible light may be green light. Light emitted from the light-emitting device 33 may be irradiated onto the surface of the 3D object 26 by using a mirror (not shown). Alternatively, point-scan may be performed without a mirror.

Light reflected through point-scanning of the 3D object 26 may travel along a collection path illustrated by each of arrows 36 and 37 and dashed lines 38 and 39. As light irradiated from the light-emitting device 33 is received, photons scattered by or reflected from the surface of the 3D object 26 may move through a light collection path. In FIG. 2, various paths illustrated by arrows and dashed lines are merely an example. A detailed path through which a real light signal is transferred is not limited to the illustrated paths.

Light received from the illuminated 3D object 26 may concentrate on one or more pixels of a two-dimensional (2D) pixel array 42 through a collection lens 44 of the image sensor 24. Similarly to the projection lens 35, the collection lens 44 may be another cylindrical optical device or a collection lens of a glass or plastic surface which concentrates reflection light, received from the 3D object 26, on one or more pixels of the 2D pixel array 42. In some embodiments, the collection lens 44 may be a concentration lens having a convex structure, but not limited thereto. Also, for convenience of description, a 3×3 pixel array is illustrated in FIG. 2, but it may be understood that a current pixel array includes thousands or millions of pixels. The 2D pixel array 42 may be a red, green, and blue (RGB) pixel array where different pixels collect light signals of different colors. The 2D pixel array 42 may include, for example, a 2D sensor such as a 2D RGB sensor, a 2D IR sensor, a 2D NIR sensor, a 2D RGBW sensor, or a 2D RGB-IR sensor each including an IR blocking filter. The system 15 may use the same pixel array 42 for imaging of 2D RGB colors (or a scene including an object) of the 3D object 26, in addition to 3D imaging (including depth measurement) of the 3D object 26.

The 2D pixel array 42 may convert received photons into electrical signals corresponding thereto, and the electrical signals may be processed by a pixel array controller 46, whereby a 3D depth image of the 3D object 26 may be determined. For example, the pixel array controller 46 may combine and calculate phase information, for depth measurement. The pixel array controller 46 may include a plurality of association circuits for controlling an operation of the 2D pixel array 42.

The processor 19 may control operations of the light source 22 and the image sensor 24. For example, the system 15 may include a mode switch (not shown) which is controlled by a user and switches a 2D imaging mode or a 3D imaging mode. When the user selects the 2D imaging mode by using the mode switch, the processor 19 may activate the image sensor 24, and the 2D imaging mode may use peripheral light, whereby the processor 19 may not activate the light source 22. On the other hand, when the user selects the 3D imaging mode by using the mode switch, the processor 19 may activate the light source 22 and the image sensor 24 and may trigger a variation of a level of a reset signal in the pixel array controller 46, and thus, when the peripheral light is too strong and thus is not reflected in a linear mode, the processor 19 may switch from the linear mode to a logarithm mode. Processed image data received from the pixel array controller 46 may be stored in the memory 20 by the processor 19. The processor 19 may display a 2D or 3D image, selected by the user, on a display screen (not shown) of the system 15. The processor 19 may be programmed with software or firmware which each performs various processing operations described. In some embodiments, the processor 19 may include programmable hardware logic circuits for performing some or all of the above-described functions. For example, the memory 20 may store program code, a lookup table, or intermediate operation results to allow the processor 19 to perform a corresponding function.

The processor 19 of the system 15 may perform 1D point-scanning of the 3D object 26 along a scan line by using the light source 22. In a portion of a point-scan operation, the light source 22 may be controlled by the processor 19 to project sequential light spots (or serial light spots) on the surface of the 3D object 26 by units of lines. The pixel array controller 46 of the system 15 may select pixels of one row in an image sensor such as the 2D pixel array 42. The image sensor such as the 2D pixel array 42 may include a plurality of pixels arranged in a 2D array configuring an image plane. A row from which pixels are selected may configure an epipolar line of the scan line in the image plane. The pixel array controller 46 may be controlled by the processor 19 to detect each light spot by using a corresponding pixel of pixels of one row. When light reflected from an illumination light spot is concentrated on two or more adjacent pixels by the collection lens 44, light reflected from the illumination light spot may be detected by a single pixel or one or more pixels. The pixel array controller 46 may be controlled by the processor 19 to generate a pixel specific output, in response to pixel specific detection of a corresponding light spot of sequential light spots. Therefore, the pixel array controller 46 may determine a 3D distance (or a depth) to a corresponding light spot of the surface of the 3D object 26, at least based on a pixel specific output and a scan angle used by the light source 22 which projects a corresponding light spot.

Figure 3:
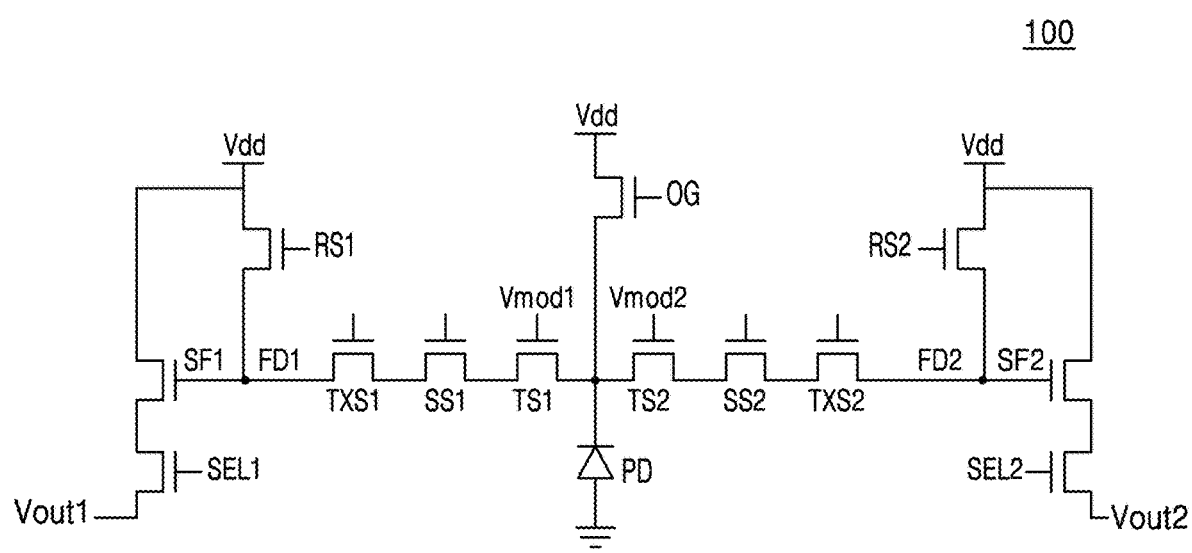
FIG. 3 is an equivalent circuit diagram corresponding to a unit pixel of an image sensor according to some example embodiments.
Figure 4:
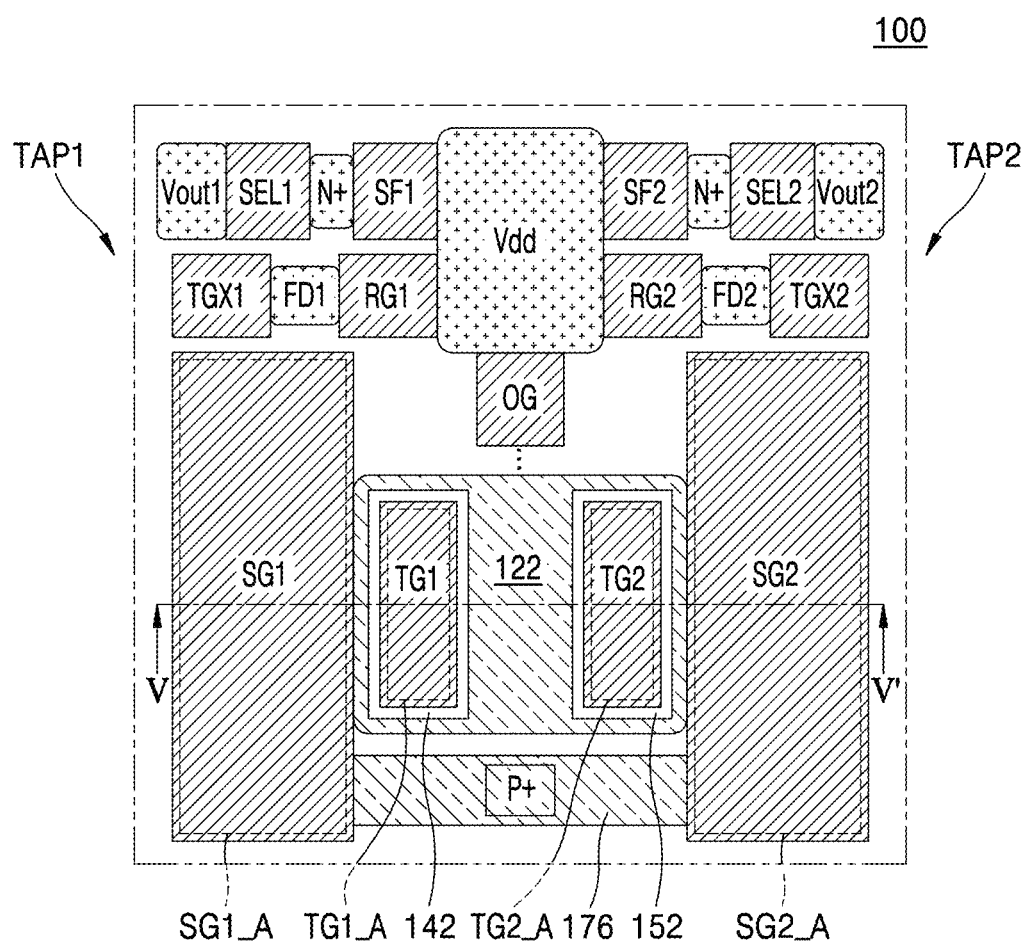
FIG. 4 is a plan view of a main portion of a unit pixel of an image sensor according to some example embodiments.
Figure 5:
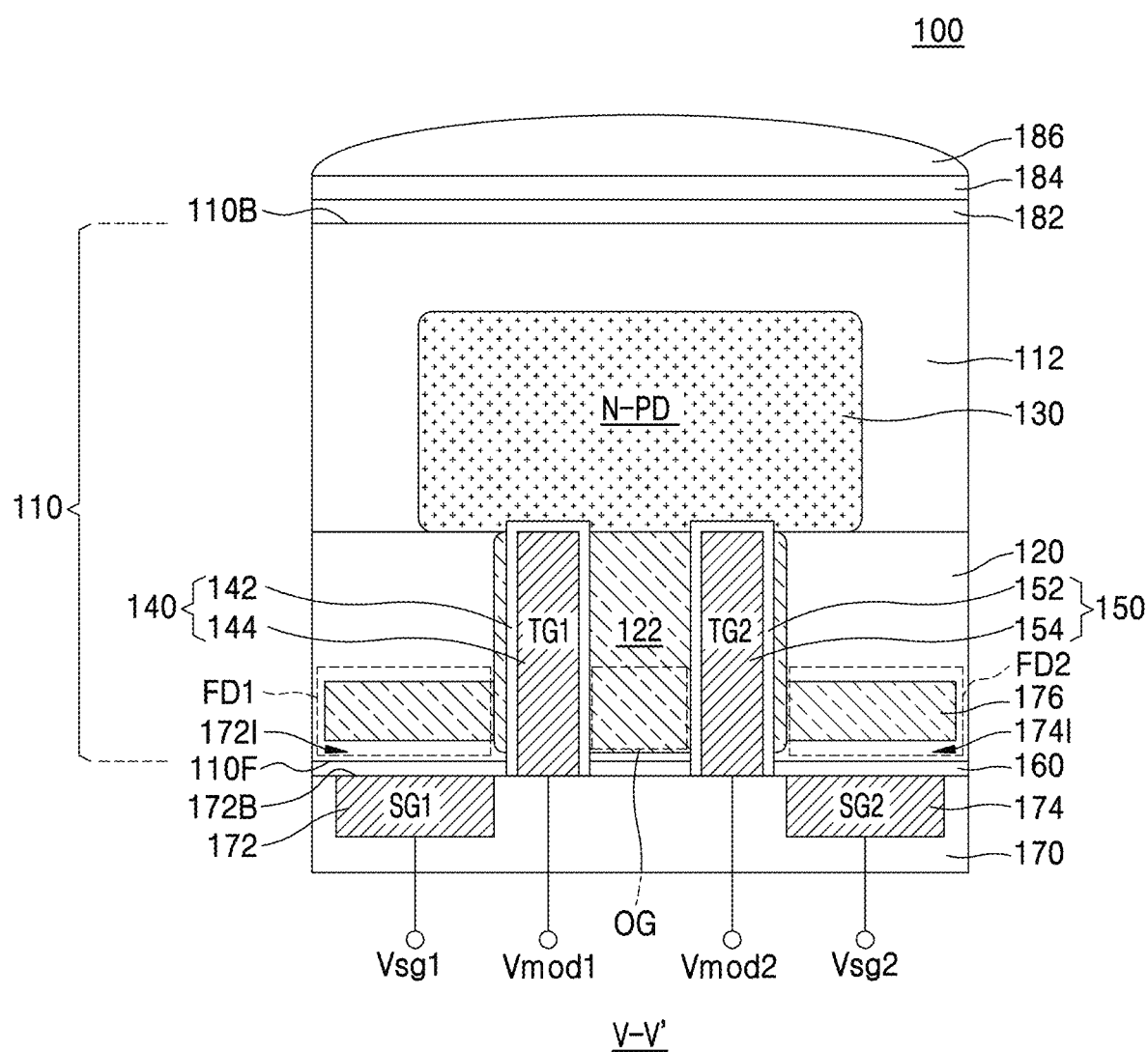
FIG. 5 is a cross-sectional view of a main portion of a unit pixel of an image sensor.

FIG. 3 is an equivalent circuit diagram corresponding to a unit pixel of an image sensor 100 according to some example embodiments. FIG. 4 is a plan view of a main portion of a unit pixel of the image sensor 100 according to some example embodiments. FIG. 5 is a cross-sectional view of a main portion of a unit pixel of the image sensor 100.

Referring to FIGS. 3 to 5, the image sensor 100 may have a 2-tap pixel structure. The 2-tap pixel structure may denote a structure where one pixel of the image sensor 100 includes two taps. Here, a tap may denote a unit component for transferring, by units of phases, photocharges which are generated and accumulated in a pixel by irradiating external light. The image sensor 100 may implement a manner of transmitting photocharges with respect to a 0-degree phase and a 180-degree phase and with respect to a 90-degree phase and a 270-degree phase by using two taps. For example, one pixel of the image sensor 100 may include a first tap part TAP1 a second tap part TAP2. The first tap part TAP1 may be a part configured to transmit photocharges with respect to a 0-degree phase, and the second tap part TAP2 may be a part configured to transmit photocharges with respect to a 180-degree phase. Alternatively, the first tap part TAP1 may be a part configured to transmit photocharges with respect to a 90-degree phase, and the second tap part TAP2 may be a part configured to transmit photocharges with respect to a 270-degree phase.

The image sensor 100 may include a semiconductor substrate 110 that includes first and second surfaces 110F and 110B which are opposite to each other. The semiconductor substrate 110 may include a well region 120 adjacent to the first surface 110F and a separate region 112 adjacent to the second surface 110B, a photoelectric conversion region 130 disposed in the semiconductor substrate 110 between the well region 120 and the second surface 110B, first and second vertical transmission gates 144 and 154 which are spaced apart from each other ("isolated from direct contact with each other") and each extend from the first surface 110F in a thickness direction of the semiconductor substrate 110, which is a direction vertical to ("perpendicular to") at least one surface of the first and second surfaces 110F and 110B, to pass ("extend") through at least a portion of the well region 120, and a wiring structure 170 disposed on the first surface 110F of the semiconductor substrate 110.

The semiconductor substrate 110 may include, for example, at least one of silicon (Si), germanium (Ge), silicon germanium (SiGe), silicon carbon (SiC), gallium arsenic (GaAs), indium arsenic (InAs), and indium phosphorus (InP). In some embodiments, the semiconductor substrate 110 may be of ("may be associated with") a first conductivity type. For example, the first conductivity type may be a p type.

The well region 120 may be of, for example, the first conductivity type. The well region 120 may be formed by doping the semiconductor substrate 110 with impurities of the first conductivity type. For example, the first conductivity type may be a p type. An impurity concentration of the well region 120 may have a value which is higher than that of an impurity concentration of a portion, other than the well region 120, of the semiconductor substrate 110.

The photoelectric conversion region 130 may be of a second conductivity type. For example, the second conductivity type may be an n type. The photoelectric conversion region 130 may be configured with a photodiode (PD). The photoelectric conversion region 130 may be referred to as an N type-photodiode (N-PD). The photoelectric conversion region 130 may overlap the first and second vertical transmission gates 144 and 154 in the thickness direction (i.e., a direction vertical to at least one of the first surface 110F and the second surface 110B) of the semiconductor substrate 110.

Each of the first and second vertical transmission gates 144 and 154 may extend to have a length of about 50 nm to about 500 nm in the thickness direction of the semiconductor substrate 110. In some embodiments, a thickness of the well region 120 may be similar to an extension length of each of the first and second vertical transmission gates 144 and 154. In some embodiments, the first and second vertical transmission gates 144 and 154 may extend in the thickness direction of the semiconductor substrate 110 to completely pass through the well region 120.

In some example embodiments, the semiconductor substrate 110 may include a demodulation region 122. The well region 120 may include a demodulation region 122. The demodulation region 122 of the well region 120 may be a region where photocharges generated in the photoelectric conversion region 130 move through the first and second vertical transmission gates 144 and 154. The demodulation region 122 may include a portion, which is disposed between the first and second vertical transmission gates 144 and 154 spaced apart from each other, of the well region 120, and moreover, may include a portion (for example, a portion, which is adjacent to a side surface opposite to each of side surfaces of the first and second vertical transmission gates 144 and 154 facing each other), which is adjacent to the first and second vertical transmission gates 144 and 154 to surround the first and second vertical transmission gates 144 and 154, of the well region 120. In some example embodiments, the demodulation region 122 may be of the first conductivity type.

A plurality of transmission gate insulation layers, for example, first and second transmission gate insulation layers 142 and 152, for insulating the well region 120 from the first and second vertical transmission gates 144 and 154 may be disposed near the first and second vertical transmission gates 144 and 154. The first vertical transmission gate 144 and the first transmission gate insulation layer 142 surrounding the first vertical transmission gate 144 may be referred to as a first transmission gate structure 140, and the second vertical transmission gate 154 and the second transmission gate insulation layer 152 surrounding the second vertical transmission gate 154 may be referred to as a second transmission gate structure 150. A first modulation voltage Vmod1 and a second modulation voltage Vmod2 may be respectively connected to the first vertical transmission gate 144 and the second vertical transmission gate 154. The first vertical transmission gate 144 and the second vertical transmission gate 154 may respectively configure a first transmission transistor TS1 and a second transmission transistor TS2.

The photoelectric conversion region 130 may overlap the demodulation region 122 in the thickness direction of the semiconductor substrate 110. Also, the photoelectric conversion region 130 may overlap both the first transmission gate structure 140 and the second transmission gate structure 150 in the thickness direction of the semiconductor substrate 110. The photoelectric conversion region 130 may be provided to have a width which is wider than the demodulation region 122 and may overlap the demodulation region 122, and thus, photocharges generated in the photoelectric conversion region 130 may concentrate and may be transferred to the demodulation region 122.

As shown in at least FIG. 5, a gate insulation layer 160 may be on the first surface 110F of the semiconductor substrate 110. The gate insulation layer 160 may cover a whole region, other than positions at which the first and second transmission gate structures 140 and 150 are disposed, of the first surface 110F, but is not limited thereto.

The wiring structure 170 may be disposed on the gate insulation layer 160. The wiring structure 170 may include a first storage gate (SG1) 172, a second storage gate (SG2) 174, a first tap transmission gate TGX1, a second tap transmission gate TGX2, a wiring, a contact plug, and an interlayer insulation layer. Here, the wiring, the contact plug, and the interlayer insulation layer may configure association circuits.

The first storage gate (SG1) 172 may be on the first surface 110F, and the second storage gate (SG2) 174 may be on the first surface 110F. The first storage gate (SG1) 172 may be disposed next to the first vertical transmission gate (TG1) 144 and the first storage gate (SG1) 172 may be on the gate insulation layer 160, such that, as shown in at least FIGS. 4-5, the first storage gate (SG1) 172 may be adjacent to the first vertical transmission gate (TG1) and the second storage gate (SG2) 174 may be adjacent to the second vertical transmission gate (TG2) 154. The second storage gate (SG2) 174 may be disposed next to the second vertical transmission gate (TG2) 154 and the second storage gate (SG2) 174 may be on the gate insulation layer 160. For example, in a plan view, the first vertical transmission gate (TG1) 144 and the second vertical transmission gate (TG2) 154 may be disposed apart from each other ("isolated from direct contact with each other") with the demodulation region 122 therebetween in a direction extending parallel to the first surface 110F such that the demodulation region 122 is understood to be between the first vertical transmission gate (TG1) 144 and the second vertical transmission gate (TG2) 154, the first storage gate (SG1) 172 may be disposed on one side of the first vertical transmission gate (TG1) 144, and the second storage gate (SG2) 174 may be disposed on one side of the second vertical transmission gate (TG2) 154. Therefore, in a plan view, the first vertical transmission gate (TG1) 144 and the second vertical transmission gate (TG2) 154 may be disposed apart from each other between the first storage gate (SG1) 172 and the second storage gate (SG2) 174. As shown in at least FIG. 4, the first storage gate (SG1) 172 may be between the first vertical transmission gate (TG1) 144 and the first floating diffusion region FD1. As shown in at least FIG. 4, the second storage gate (SG2) 174 may be between the second vertical transmission gate (TG2) 154 and the second floating diffusion region FD2.

The first storage gate (SG1) 172 and the second storage gate (SG2) 174 may respectively configure a first storage transistor SS1 and a second storage transistor SS2, and as illustrated in FIG. 3, the first storage transistor SS1 may be connected to the first transmission transistor TS1 without another transistor therebetween, and the second storage transistor SS2 may be connected to the second transmission transistor TS2 without another transistor therebetween.

A barrier impurity region 176 disposed apart from the first surface 110F (e.g., isolated from direct contact with the first surface 110F) may be disposed in the semiconductor substrate 110 on (e.g., "under") the first storage gate (SG1) 172 and the second storage gate (SG2) 174. The barrier impurity region 176 may be of ("may be associated with") the first conductivity type.

A first charge storage region 1721 and a second charge storage region 1741 may be disposed in the semiconductor substrate 110 under the first storage gate (SG1) 172 and the second storage gate (SG2) 174. For example, the first charge storage region 1721 may be disposed between the first surface 110F and the barrier impurity region 176 at a position vertically overlapping the first storage gate (SG1) 172, and the second charge storage region 1741 may be disposed between the first surface 110F and the barrier impurity region 176 at a position vertically overlapping the second storage gate (SG2) 174. The first charge storage region 1721 and the second charge storage region 1741 may each be a temporary charge storage region which temporarily stores photocharges generated in the photoelectric conversion region 130 before being transferred to floating diffusion regions FD1 and FD2 after being transferred to the demodulation region 122.

The first storage gate (SG1) 172 and the second storage gate (SG2) 174 may be disposed on the first surface 110F of the semiconductor substrate 110 with the gate insulation layer 160 therebetween, and for example, a bottom surface 172B of the first storage gate (SG1) 172 may be higher in level than (e.g., distal to the second surface 110B in relation to) the first surface 110F of the semiconductor substrate 110. Also, in a plan view, an area of each of the first storage gate (SG1) 172 and the second storage gate (SG2) 174 may be greater than that of each of the first vertical transmission gate (TG1) 144 and the second vertical transmission gate (TG2) 154. For example, each of the first vertical transmission gate (TG1) 144 and the second vertical transmission gate (TG2) 154 may have a vertical gate structure which is disposed in a recess (not shown) extending in the thickness direction of the semiconductor substrate 110 from the first surface 110F of the semiconductor substrate 110, and thus, in a unit pixel, an area occupied by the first vertical transmission gate (TG1) 144 and the second vertical transmission gate (TG2) 154 may be reduced, whereby each of the first storage gate (SG1) 172 and the second storage gate (SG2) 174 may have a relatively large surface area SG1_A and SG2_A, respectively, along a surface extending parallel to the first surface 110F. For example, as shown in FIG. 4, the surface area SG1_A of the first storage gate (SG1) 172 along a surface extending parallel to the first surface 110F may be greater than the surface area TG1_A of the first vertical transmission gate (TG1) 144 along a surface extending parallel to the first surface 110F. In another example, as shown in FIG. 4, the surface area SG2_A of the second storage gate (SG2) 174 along a surface extending parallel to the first surface 110F may be greater than the surface area TG2_A of the second vertical transmission gate (TG2) 154 along a surface extending parallel to the first surface 110F.

It will be understood that an element that is described to be "on" another element herein may be "above" or "under" the other element and may be "directly on" the other element so as to be in direct contact with the other element or may be "indirectly on" the other element so as to be isolated from direct contact with the other element by one or more interposing structures and/or spaces.

The first tap transmission gate TGX1 may be disposed on the gate insulation layer 160 at one side of the first storage gate (SG1) 172, such that the first tap transmission gate TGX1 is on the first surface 110F. The first floating diffusion region FD1 may be included in the semiconductor substrate 110 and may be adjacent to the first surface 110F, as shown in at least FIG. 5. As shown in at least FIG. 4, the first tap transmission gate TGX1 may be adjacent to the first storage gate (SG1) 172. The first floating diffusion region FD1 may be disposed at a position adjacent to the first surface 110F and the first tap transmission gate TGX1 in the well region 120 of the semiconductor substrate 110. That is, in a plan view, the first tap transmission gate TGX1 may be disposed between the first floating diffusion region FD1 and the first storage gate (SG1) 172. The first tap transmission gate TGX1 may configure a first tap transmission transistor TXS1 for transferring photocharges, temporarily stored in the first charge storage region 1721 under the first storage gate (SG1) 172, to the first floating diffusion region FD1. Restated, the image sensor 100 may include a first tap transmission transistor TXS1 that is configured to transfer a photocharge, that is stored in the first charge storage region 1721 on (e.g., "under") the first storage gate (SG1) 172, to the first floating diffusion region FD1, where the first tap transmission transistor TXS1 includes the first tap transmission gate TGX1. Restated, the first tap transmission gate TGX1 may be a transistor gate of the first tap transmission transistor TXS1.

The second tap transmission gate TGX2 may be disposed on the gate insulation layer 160 at one side of the second storage gate (SG2) 174, such that the second tap transmission gate TGX2 is on the first surface 110F. As shown in at least FIG. 4, the second tap transmission gate TGX2 may be adjacent to the second storage gate (SG2) 174. The second floating diffusion region FD2 may be included in the semiconductor substrate 110 and may be adjacent to the first surface 110F, as shown in at least FIG. 5. The second storage gate (SG2) 174 may be between the second vertical transmission gate (TG2) 154 and the second floating diffusion region FD2. The second floating diffusion region FD2 may be disposed at a position adjacent to the first surface 110F and the second tap transmission gate TGX2 in the well region 120 of the semiconductor substrate 110. That is, in a plan view, the second tap transmission gate TGX2 may be disposed between the second floating diffusion region FD2 and the second storage gate (SG2) 174. The second tap transmission gate TGX2 may configure a second tap transmission transistor TXS2 for transferring photocharges, temporarily stored in the second charge storage region 1741 under the second storage gate (SG2) 174, to the second floating diffusion region FD2.

The first floating diffusion region FD1 and the second floating diffusion region FD2 may be respectively connected to a first reset gate RG1 and a second reset gate RG2. The first reset gate RG1 and the second reset gate RG2 may respectively configure a first reset transistor RS1 and a second reset transistor RS2. A drain of each of the first reset gate RG1 and the second reset gate RG2 may be connected to a Vdd voltage. Also, a source and a drain of a first source follower transistor SF1 may be respectively connected to a source of a first selection transistor SEL1 and the Vdd voltage. A first output voltage Vout1 may be output to a drain of the first selection transistor SELL. A source and a drain of a second source follower transistor SF2 may be respectively connected to a source of a second selection transistor SEL2 and the Vdd voltage. A second output voltage Vout2 may be output to a drain of the second selection transistor SEL2. A source of each of the first and second source follower transistors SF1 and SF2 and the first and second selection transistors SEL1 and SEL2 may be a region illustrated by N+.

As shown in at least FIG. 4, an overflow gate OG may be disposed on the first surface 110F of the semiconductor substrate 110. A source of the overflow gate OG may be connected to one side of the demodulation region 122, and a drain of the overflow gate OG may be connected to the Vdd voltage. The overflow gate OG may be provided for discharging and removing an overflow charge. For example, the image sensor 100 may read and output a light signal, based on a global shutter manner. For example, the global shutter manner may use a manner of simultaneously resetting all pixels of the image sensor 100, accumulating light signals, and sequentially reading pixel information by units of rows. The overflow charge may occur due to undesired external light in a process of reading and outputting a light signal, and the overflow charge may be discharged and removed by the overflow gate OG.

The image sensor 100 may further include a micro-lens 186 disposed on the second surface 110B of the semiconductor substrate 110. The second surface 110B of the semiconductor substrate 110 may be a light incident surface. At least one of a negative fixed charge layer 182 and an antireflection layer 184 may be disposed between the second surface 110B of the semiconductor substrate 110 and the micro-lens 186. In some embodiments, the negative fixed charge layer 182, the antireflection layer 184, and the micro-lens 186 may be stacked and disposed on the second surface 110B of the semiconductor substrate 110. In some embodiments, the negative fixed charge layer 182 may directly contact the second surface 110B of the semiconductor substrate 110 and may cover the second surface 110B of the semiconductor substrate 110. In some embodiments, a buffer layer or a color filter layer (not shown) may be further disposed between the micro-lens 186 and the antireflection layer 184. The negative fixed charge layer 182 may include, for example, a high-k dielectric material such as hafnium oxide ($HfO_x$), aluminum oxide ($AlO_x$), or zirconium oxide ($ZrO_x$). The antireflection layer 184 may include, for example, SiON, SiC, SIGN, or SiCO.

Generally, a time-of-flight (ToF)-based image sensor may be configured by serially arranging a plurality of gates including a photogate, a first tap transmission gate, a storage gate, and a second tap transmission gate on each pixel, for implementing an accurate correlated double sampling (CDS) operation to minimize read noise. However, it is difficult to decrease an area occupied by the plurality of gates, and due to this, it is difficult to miniaturize each pixel of the image sensor.

However, the image sensor 100 according to some example embodiments may include the first and second vertical transmission gates 144 and 154, the first storage gate SG1 and the first tap transmission gate TGX1 may be sequentially disposed next to the first vertical transmission gate 144, and the second storage gate SG2 and the second tap transmission gate TGX2 may be sequentially disposed next to the second vertical transmission gate 154. As shown in at least FIG. 4, the first tap transmission gate TGX1 may be between the first storage gate (SG1) 172 and the first floating diffusion region FD1. As shown in at least FIG. 4, the second tap transmission gate TGX2 may be between the second storage gate (SG2) 174 and the second floating diffusion region FD2. Therefore, the first vertical transmission gate (TG1) 144 of the first transmission transistor TS1 and the second vertical transmission gate (TG2) 154 of the second transmission transistor TS2 may be provided relatively long, and an area of each of the first and second storage gates SG1 and SG2 may be provided relatively large. Accordingly, each pixel configuring the image sensor 100 may be miniaturized, a charge storage capacity may increase, and read noise may be minimized.

Figure 6:
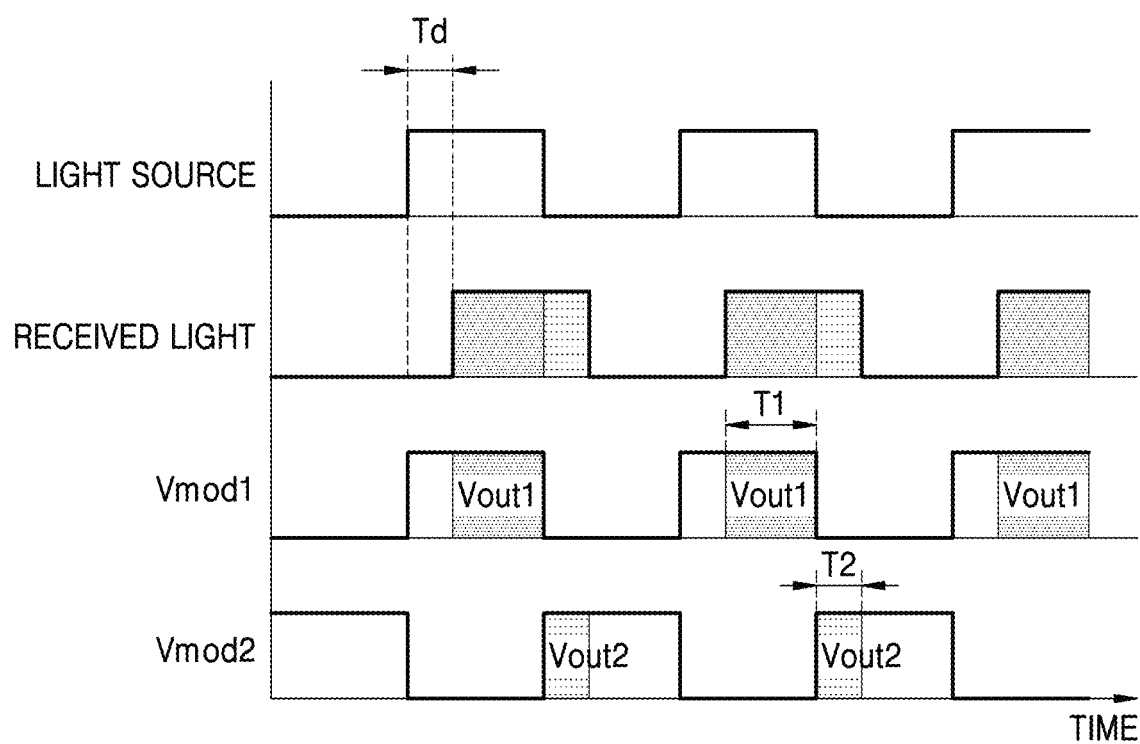
FIG. 6 is a timing diagram for describing an operation of an image sensor for distance measurement, according to some example embodiments.
Figure 7:
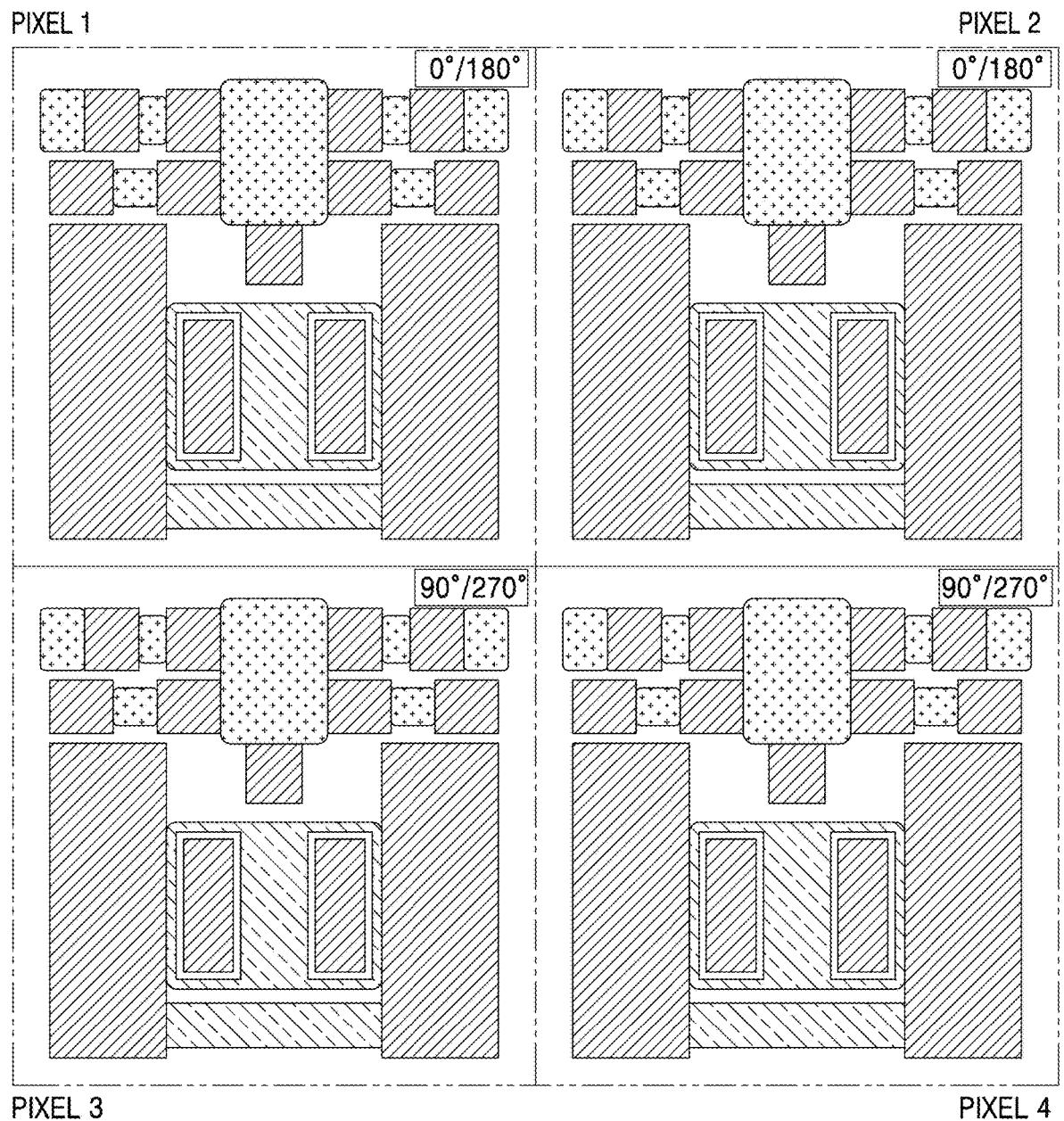
FIG. 7 is a plan view of a pixel array of an image sensor according to some example embodiments.
Figure 8:
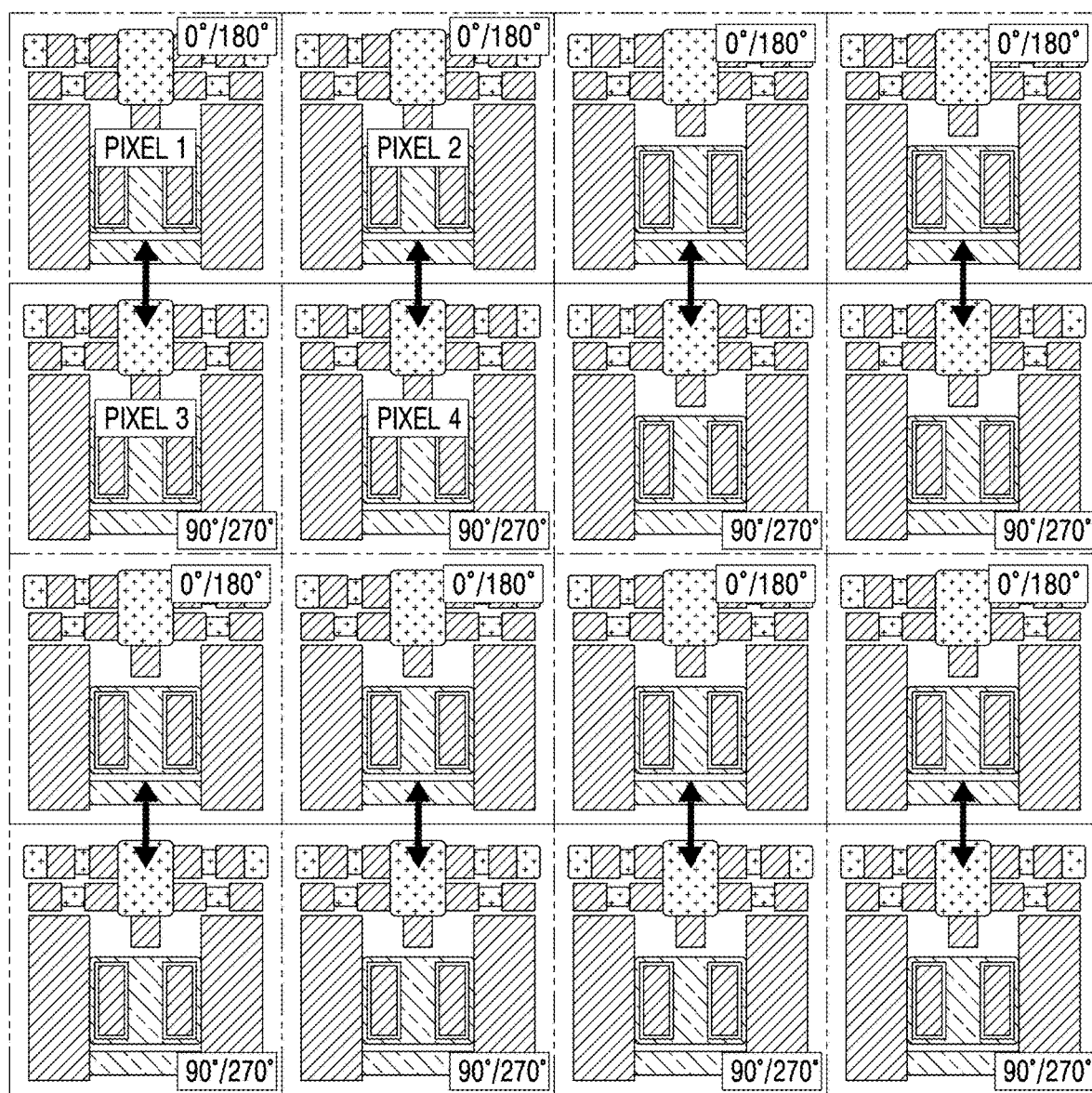
FIGS. 8 and 9 are plan views of a pixel array for describing an operation of an image sensor for distance measurement, according to some example embodiments.
Figure 9:
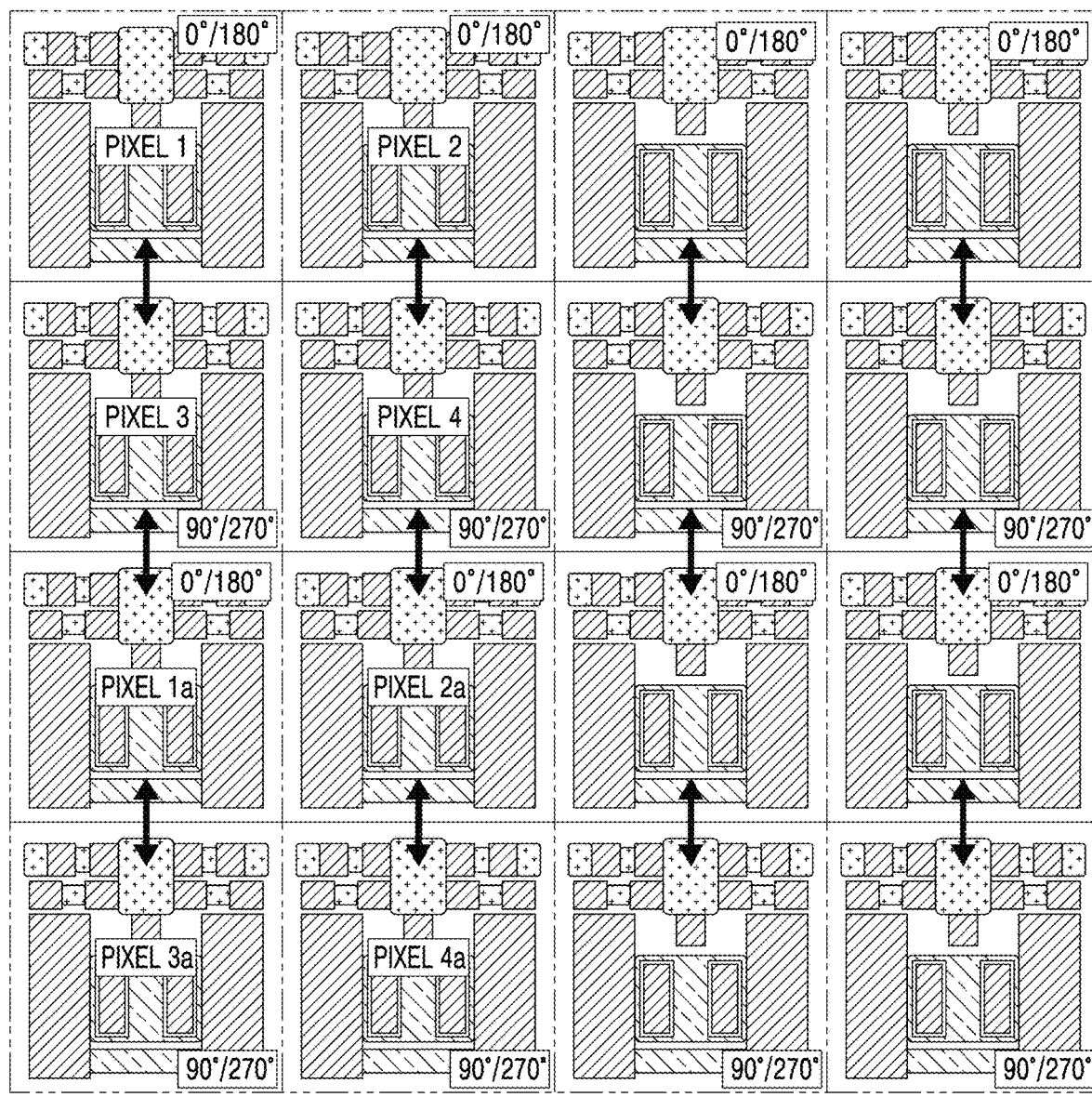

FIG. 6 is a timing diagram for describing an operation of an image sensor for distance measurement, according to some example embodiments. FIG. 7 is a plan view of a pixel array of an image sensor according to some example embodiments. FIGS. 8 and 9 are plan views of a pixel array for describing an operation of an image sensor for distance measurement, according to some example embodiments.

Referring to FIG. 6, output light from a light source (22 of FIG. 2) and reflection light which is reflected by a 3D object (26 of FIG. 2) and received by an image sensor (100 of FIG. 3) may have a delay time Td. The output light may be a pulse light signal based on a pulse voltage. In some embodiments, the pulse light signal may have a frequency of about 10 MHz to about 100 MHz.

A first modulation voltage Vmod1 applied to a first vertical transmission gate (TG1 of FIG. 3) may be a pulse voltage synchronized with the pulse light signal. A second modulation voltage Vmod2 applied to a second vertical transmission gate (TG2 of FIG. 3) may be a pulse voltage having a phase difference with the pulse light signal. In some embodiments, the phase difference may be about 180 degrees.

As a difference T1-T2 between a time T1 for which a pulse signal of the reflection light overlaps a pulse voltage of the first vertical transmission gate TG1 and a time T2 for which the pulse signal of the reflection light overlaps a pulse voltage of the second vertical transmission gate TG2 increases, a measured distance may be shortly shown. A first output voltage Vout1 may be generated for the time T1 for which the pulse signal of the reflection light overlaps the pulse voltage of the first vertical transmission gate TG1, and a second output voltage Vout2 may be generated for the time T2 for which the pulse signal of the reflection light overlaps the pulse voltage of the second vertical transmission gate TG2. Therefore, a difference between the first output voltage Vout1 and the second output voltage Vout2 may be analyzed by, for example, a 2-phase algorithm, and thus, a distance between the image sensor 100 and the 3D object 26 may be determined. The first output voltage Vout1 and the second output voltage Vout2 may be represented by a sum of a plurality of reflection light pulse signals as well as a single reflection light pulse signal.

In some embodiments, a 4-phase algorithm may analyze a first output voltage Vout1 and a second output voltage Vout2 each obtained by applying, as the first and second modulation voltages Vmod1 and Vmod2, a pulse voltage synchronized with the pulse light signal and a pulse voltage having a 180-degree phase difference with the pulse light signal and a first output voltage Vout1 and a second output voltage Vout2 each obtained by applying, as the first and second modulation voltages Vmod1 and Vmod2, pulse voltages having a 90-degree phase difference and a 270-degree phase difference with the pulse light signal, and thus, the distance between the image sensor 100 and the 3D object 26 may be determined.

Referring to FIGS. 7 and 8, reflection light having a 0-degree phase and reflection light having a 180-degree phase may be collected in a first pixel PIXEL1, and reflection light having a 90-degree phase and reflection light having a 270-degree phase may be collected in a third pixel PIXEL3. For example, a first modulation voltage (Vmod1 of FIG. 6) of the first pixel PIXEL1 may be a pulse voltage synchronized with a pulse light signal, and a second modulation voltage (Vmod2 of FIG. 6) of the first pixel PIXEL1 may be a pulse voltage having a 180-degree phase difference with the pulse light signal. Also, a first modulation voltage Vmod1 of the third pixel PIXEL3 may be a pulse voltage having a 90-degree phase difference with the pulse light signal, and a second modulation voltage Vmod2 of the third pixel PIXEL3 may be a pulse voltage having a 270-degree phase difference with the pulse light signal. In this case, first and second output voltages (Vout1 and Vout2 of FIG. 6) of each of the first pixel PIXEL1 and the third pixel PIXEL3 may be analyzed by the 4-phase algorithm, and thus, the distance between the image sensor 100 and the 3D object 26 may be determined. Likewise, first and second output voltages Vout1 and Vout2 of each of two pixels such as a second pixel PIXEL2 and a fourth pixel PIXEL4 in a pixel array may be analyzed by the 4-phase algorithm, and thus, a distance between the image sensor 100 and a surface of the 3D object 26 may be determined. That is, one piece of distance information may be obtained from two pixels.

Referring to FIG. 9, first and second output voltages Vout1 and Vout2 of each of a first pixel PIXEL1 and a third pixel PIXEL3 may be analyzed, and first and second output voltages Vout1 and Vout2 of each of another first pixel PIXEL1*a* and the third pixel PIXEL3 may be analyzed, whereby a distance may be determined. That is, the first and second output voltages Vout1 and Vout2 of the third pixel PIXEL3 may be used simultaneously with analyzing the first and second output voltages Vout1 and Vout2 of the first pixel PIXEL1 and may be used simultaneously with analyzing the first and second output voltages Vout1 and Vout2 of the other first pixel PIXEL1*a*. Also, the other first pixel PIXEL1*a* may be used along with analyzing another third pixel PIXEL3*a* as well as analyzing the third pixel PIXEL3. Likewise, a fourth pixel PIXEL4 may be used along with analyzing the second pixel PIXEL2 and another second pixel PIXEL2*a*, and the other second pixel PIXEL2*a* may be used along with analyzing another fourth pixel PIXEL4*a*.

Therefore, considering a whole pixel array, one piece of distance information may be obtained from one pixel, and thus, a resolution of distance information may increase.

Figure 10:
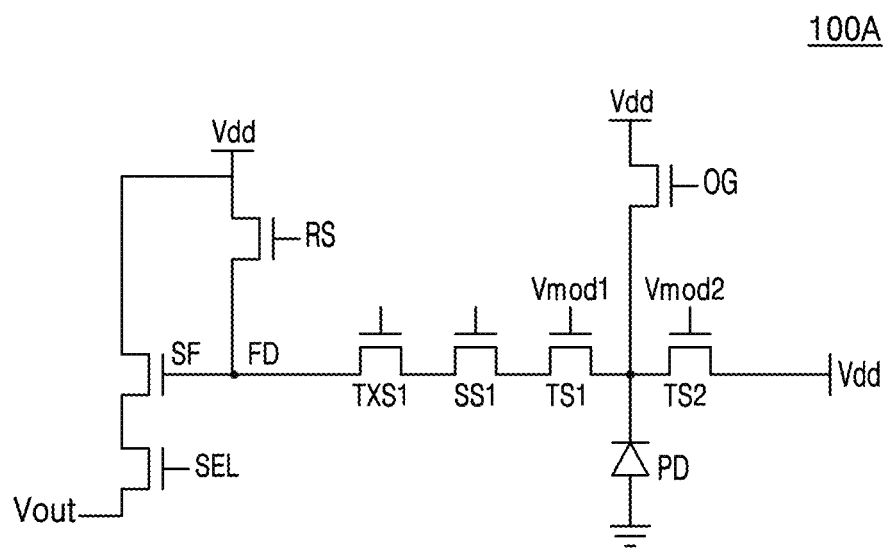
FIG. 10 is an equivalent circuit diagram corresponding to a unit pixel of an image sensor according to some example embodiments.
Figure 11:
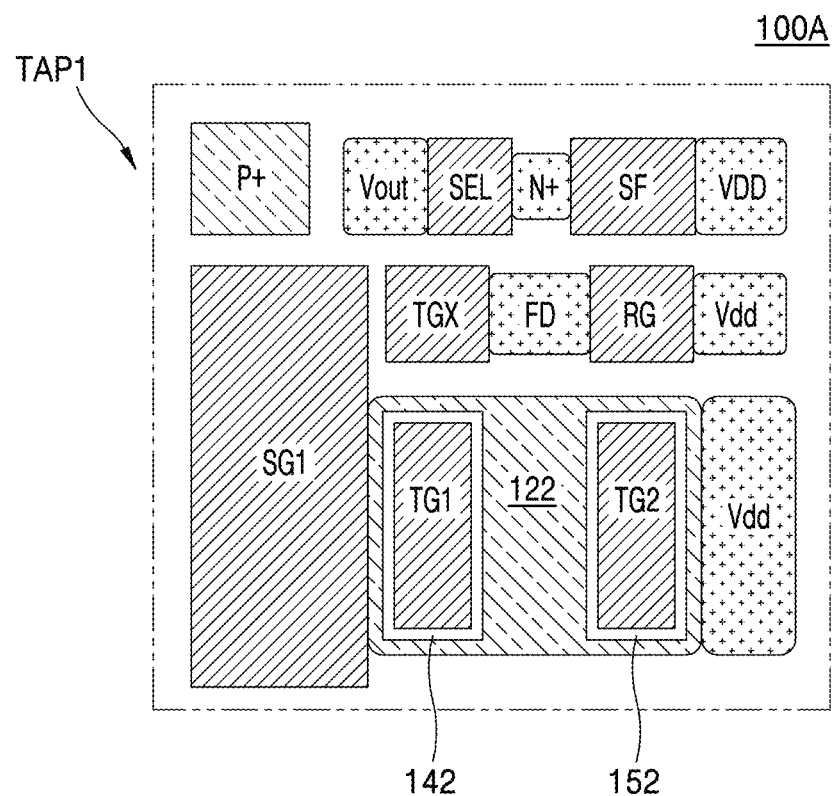
FIG. 11 is a plan view of a main portion of a unit pixel of an image sensor according to some example embodiments.
Figure 12:
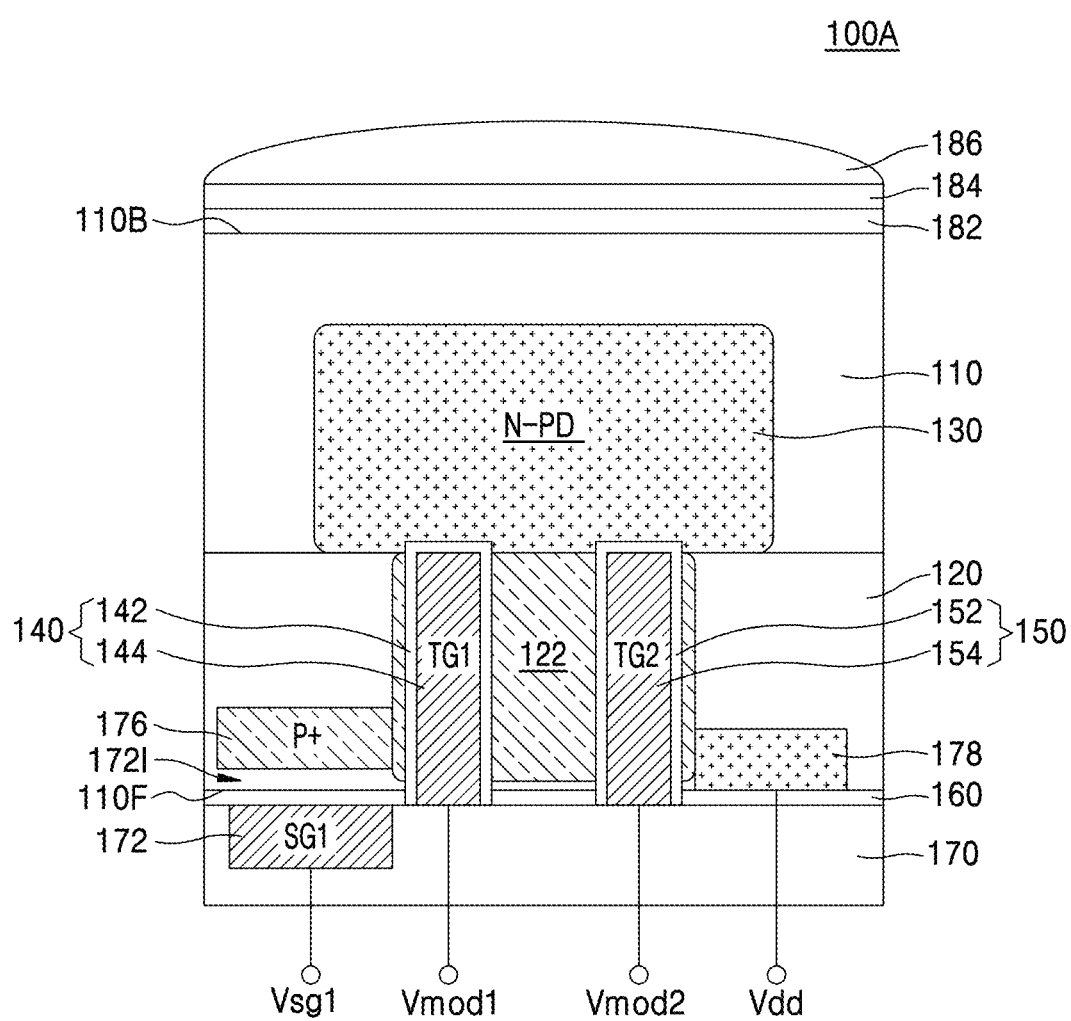
FIG. 12 is a cross-sectional view of a main portion of a unit pixel of an image sensor according to some example embodiments.

FIG. 10 is an equivalent circuit diagram corresponding to a unit pixel of an image sensor 100A according to some example embodiments. FIG. 11 is a plan view of a main portion of a unit pixel of the image sensor 100A according to some example embodiments. FIG. 12 is a cross-sectional view of a main portion of a unit pixel of the image sensor 100A according to some example embodiments.

Referring to FIGS. 10 to 12, the image sensor 100A may have a 1-tap pixel structure. The 1-tap pixel structure may denote a structure where one pixel of the image sensor 100A includes one tap. The image sensor 100A may include a first tap part TAP1, and by using the first tap part TAP1, transmission may be performed based on each of a 0-degree phase, a 90-degree phase, a 180-degree phase, and a 270-degree phase.

In a plan view, a first storage gate SG1 may be on one side of a first vertical transmission gate (TG1) 144, and a tap transmission gate TGX may be disposed between the first storage gate SG1 and a floating diffusion region FD. The floating diffusion region FD may be connected to a reset gate RG, and a drain of the reset gate RG may be connected to a Vdd voltage. Also, a source and a drain of a source follower transistor SF may be respectively connected to a source of a selection transistor SEL and the Vdd voltage. A first output voltage Vout may be output to a drain of the selection transistor SEL.

An impurity region 178 may be disposed in a well region 120 disposed on one side of a second vertical transmission gate (TG2) 154. The Vdd voltage may be connected to the impurity region 178. For example, the second vertical transmission gate (TG2) 154 may function as an overflow gate for discharging and removing an overflow charge which occurs due to undesired external light in a process of reading and outputting a light signal.

In the image sensor 100A according to some example embodiments, a gate TG1 of a transmission transistor TS1 and a gate TG2 of a transmission transistor TS2 may be provided relatively long, and an area of the first storage gate SG1 may be provided relatively large. Accordingly, each pixel configuring the image sensor 100A may be miniaturized, and read noise may be minimized.

Figure 13:
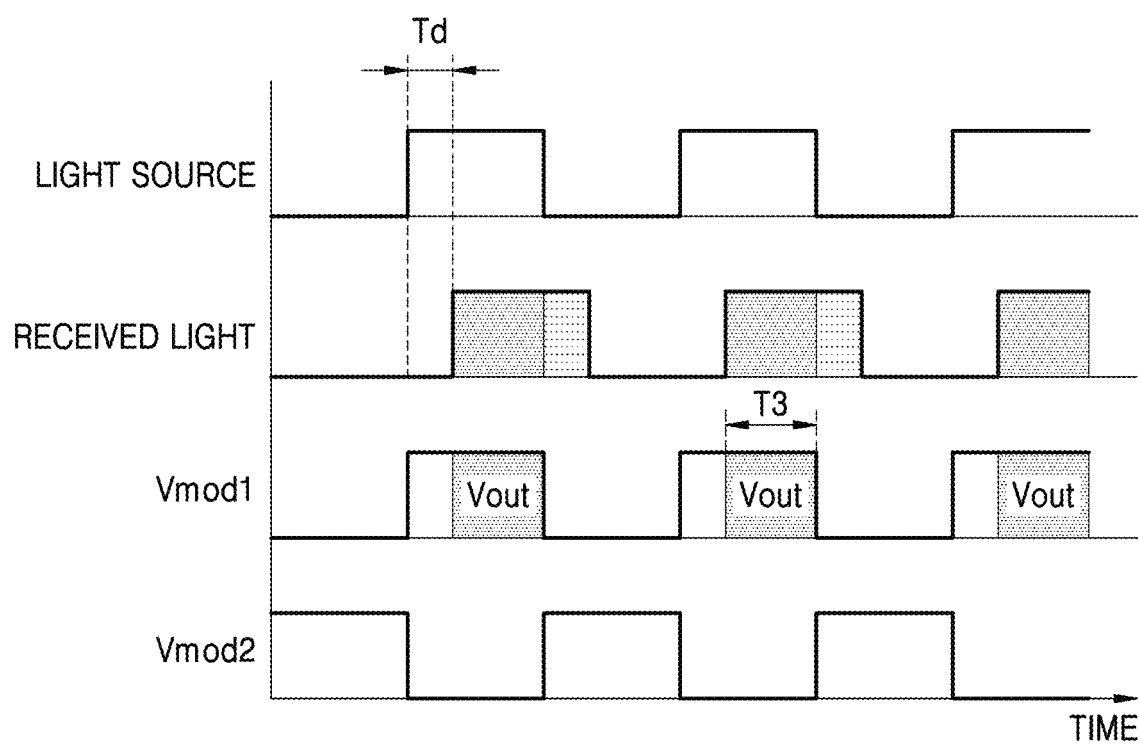
FIG. 13 is a timing diagram for describing an operation of an image sensor for distance measurement, according to some example embodiments.
Figure 14:
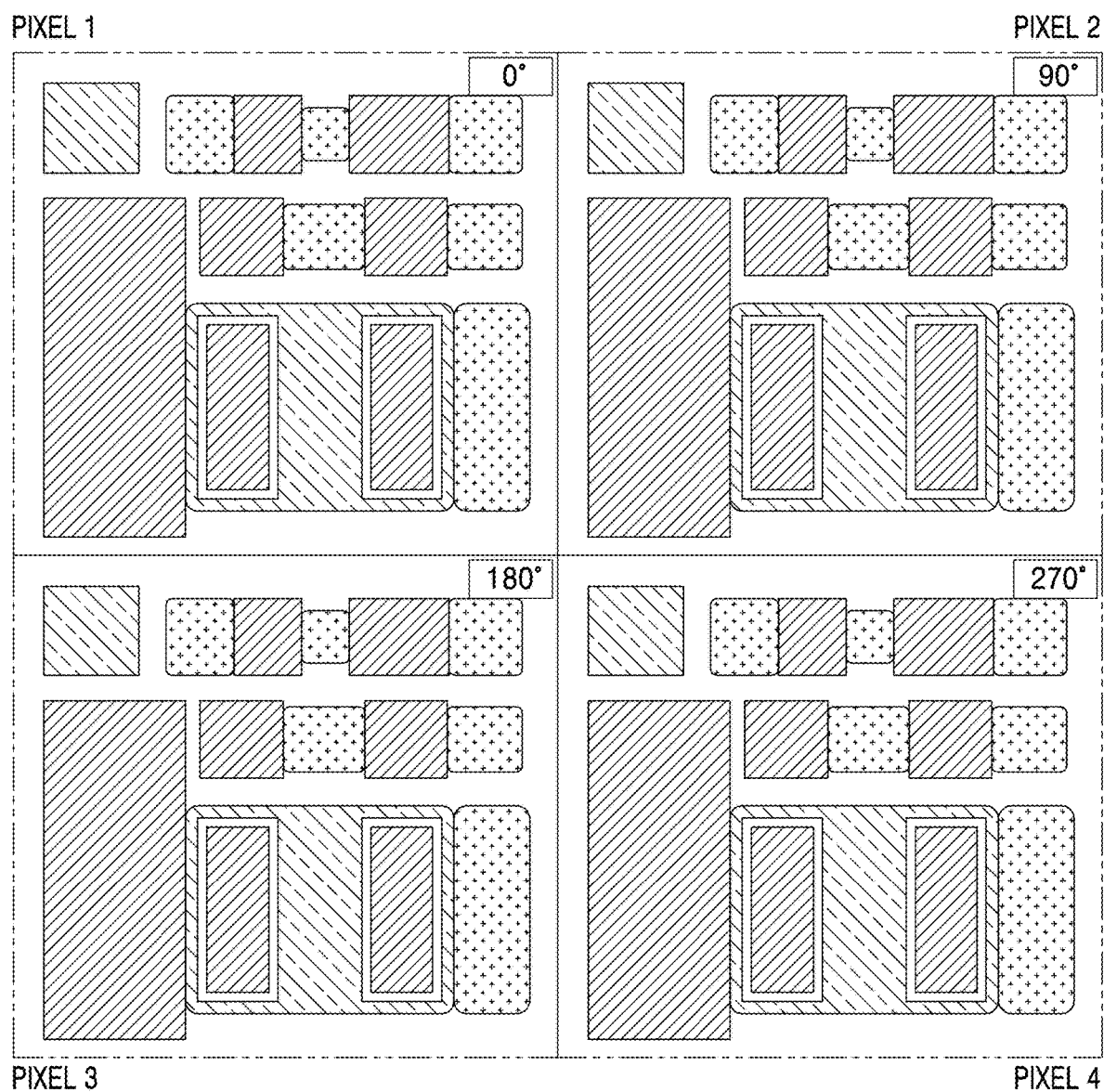
FIG. 14 is a plan view of a pixel array of an image sensor according to some example embodiments.
Figure 15:
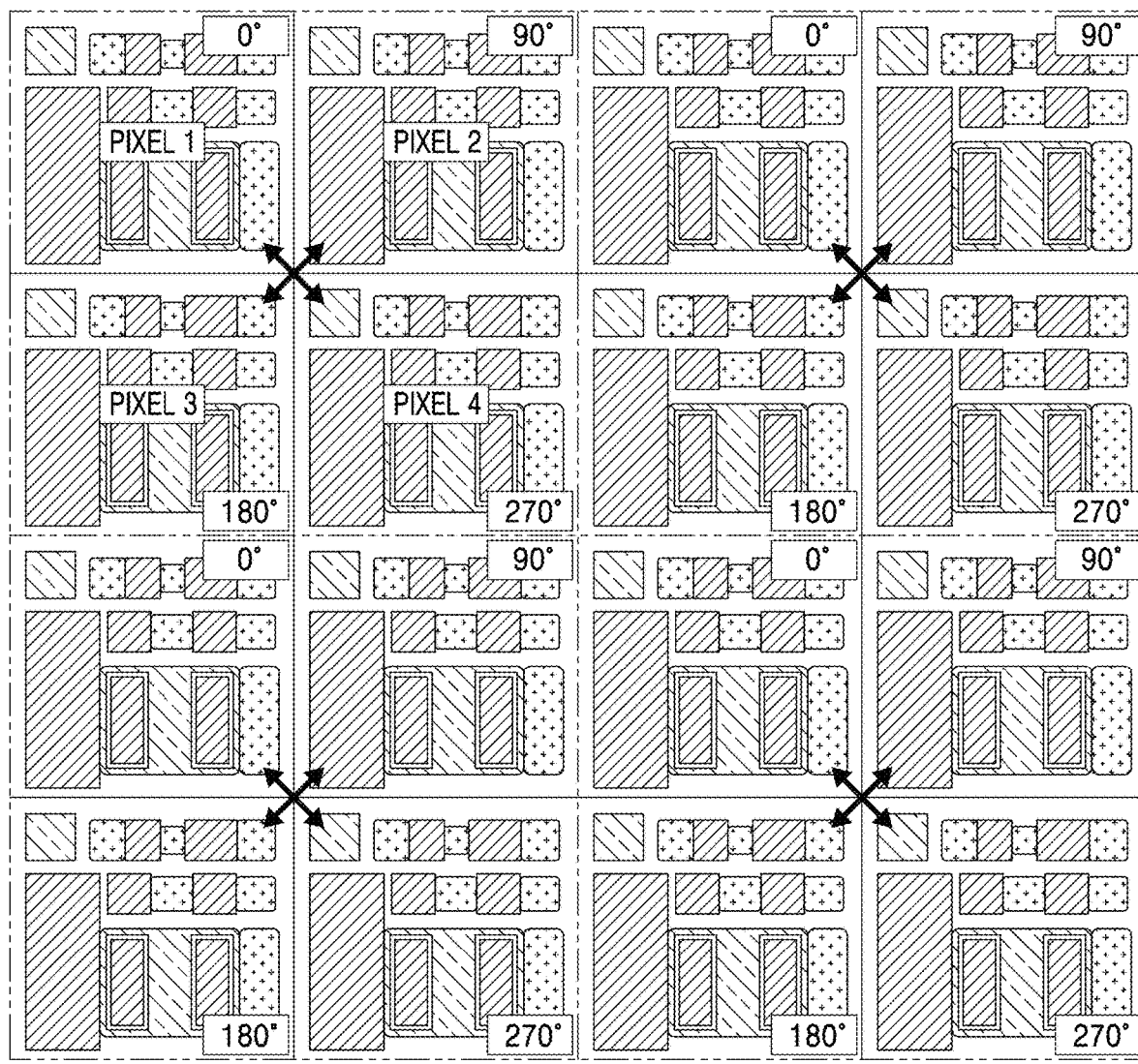
FIG. 15 is a plan view of a pixel array for describing an operation of an image sensor for distance measurement, according to some example embodiments.

FIG. 13 is a timing diagram for describing an operation of an image sensor for distance measurement, according to some example embodiments. FIG. 14 is a plan view of a pixel array of an image sensor according to some example embodiments. FIG. 15 is a plan view of a pixel array for describing an operation of an image sensor for distance measurement, according to some example embodiments.

Referring to FIG. 13, output light from a light source (see of FIG. 2) and reflection light which is reflected by a 3D object (26 of FIG. 2) and received by an image sensor (100A of FIG. 11) may have a delay time Td. The output light may be a pulse light signal based on a pulse voltage. A pulse voltage synchronized with the pulse light signal, a pulse voltage having a 90-degree phase difference with the pulse light signal, a pulse voltage having a 180-degree phase difference with the pulse light signal, and a pulse voltage having a 270-degree phase difference with the pulse light signal may be sequentially applied as a first modulation voltage Vmod1 to a first vertical transmission gate (TG1 of FIG. 12), and thus, first vertical voltages Vout generated for a time T3 for which a pulse signal of the reflection light overlaps a pulse voltage of the first vertical transmission gate TG1 may be analyzed by the 4-phase algorithm, whereby a distance between the image sensor 100A and the 3D object 26 may be determined. The first output voltages Vout may be represented by a sum of a plurality of reflection light pulse signals as well as a single reflection light pulse signal. A second modulation voltage Vmod2 applied to a second vertical transmission gate (TG2 of FIG. 11) may be a pulse voltage having a 180-degree phase difference with the first modulation voltage Vmod1.

In some embodiments, a pulse voltage synchronized with the pulse light signal and a pulse voltage having a 180-degree phase with the pulse light signal may be sequentially applied as the first modulation voltage Vmod1 to the first vertical transmission gate TG1, and thus, first output voltages Vout generated for the time T3 for which the pulse signal of the reflection light overlaps the pulse voltage of the first vertical transmission gate TG1 may be analyzed by the 2-phase algorithm, whereby the distance between the image sensor 100A and the 3D object 26 may be determined. The first output voltages Vout may be represented by a sum of a plurality of reflection light pulse signals as well as a single reflection light pulse signal.

Referring to FIGS. 14 and 15, reflection light having a 0-degree phase may be collected in a first pixel PIXEL1, reflection light having a 90-degree phase may be collected in a second pixel PIXEL2, reflection light having a 180-degree phase may be collected in a third pixel PIXEL3, and reflection light having a 270-degree phase may be collected in a fourth pixel PIXEL4. In this case, a first output voltage (Vout of FIG. 13) of each of the first to fourth pixels PIXEL1 to PIXEL4 may be analyzed by the 4-phase algorithm, and thus, the distance between the image sensor 100A and the 3D object 26 may be determined. That is, one piece of distance information may be obtained from four pixels.

Although not shown, similarly to description given above with reference to FIG. 9, a first output voltage (Vout of FIG. 13) of each of four adjacent pixels such as PIXEL1, PIXEL2, PIXEL3, and PIXEL4, or PIXEL1a (see FIG. 9), PIXEL2a (see FIG. 9), PIXEL3, and PIXEL4 may be analyzed by the 4-phase algorithm, and thus, the distance between the image sensor 100A and the 3D object 26 may be determined. That is, one piece of distance information may be obtained from one pixel.

Figure 16:
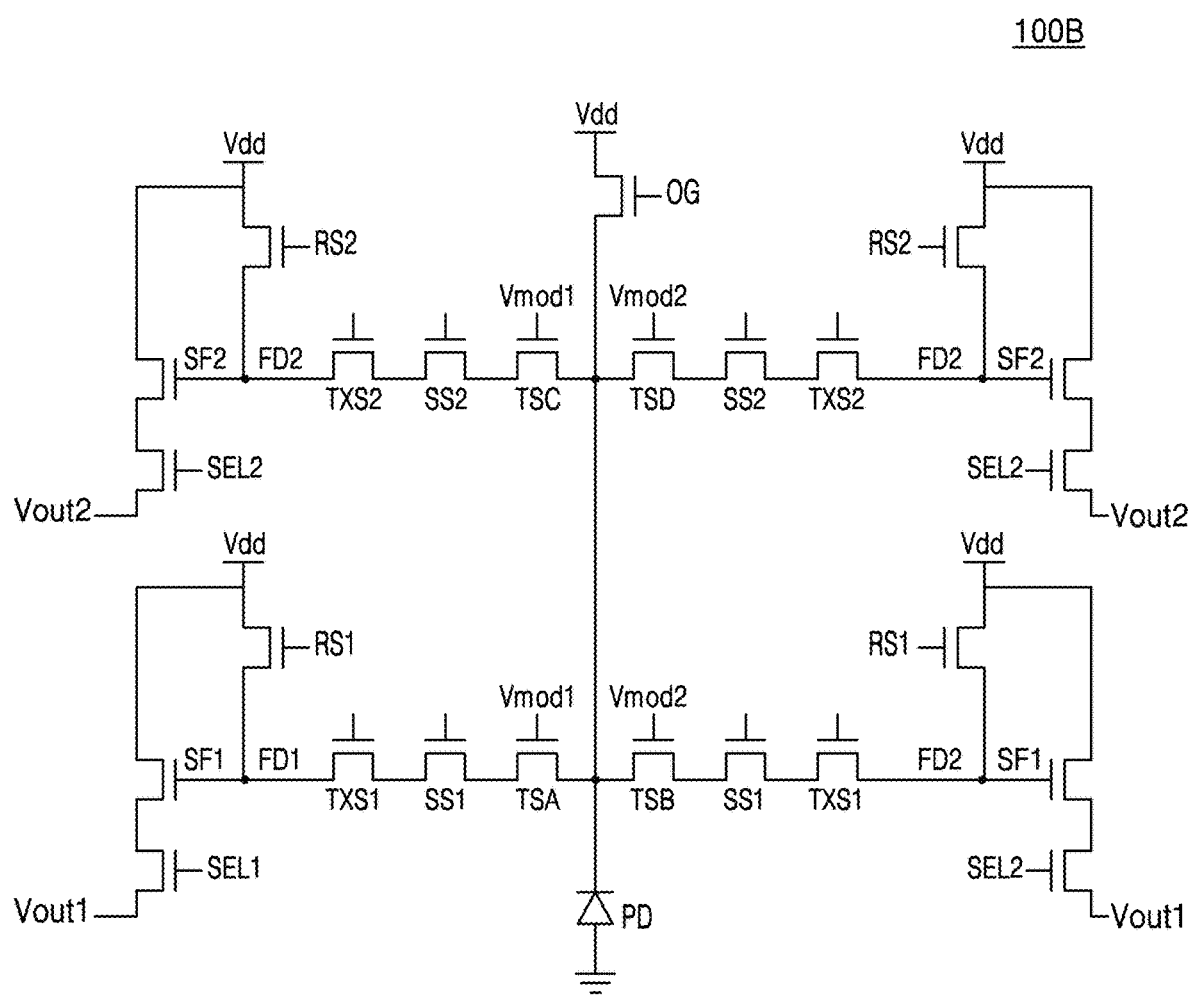
FIG. 16 is an equivalent circuit diagram corresponding to a unit pixel of an image sensor according to some example embodiments.
Figure 17:
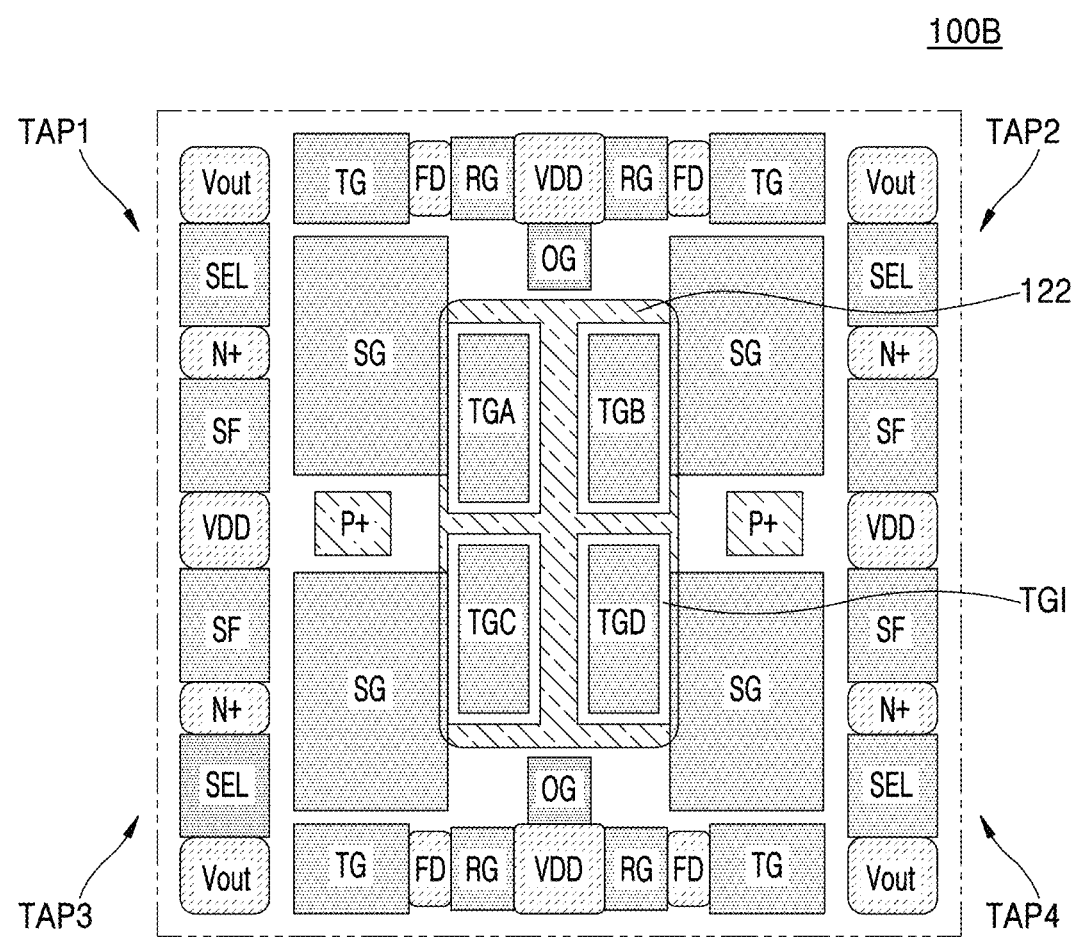
FIG. 17 is a plan view of a main portion of a unit pixel of an image sensor according to some example embodiments.

FIG. 16 is an equivalent circuit diagram corresponding to a unit pixel of an image sensor 100B according to some example embodiments. FIG. 17 is a plan view of a main portion of a unit pixel of the image sensor 100B according to some example embodiments.

Referring to FIGS. 16 and 17, the image sensor 100B may have a 4-tap pixel structure. One pixel of the image sensor 100B may include a first tap part TAP1, a second tap part TAP2, a third tap part TAP3, and a fourth tap part TAP4, and by using the first to fourth tap parts TAP1 to TAP4, transmission may be performed based on all phases of a 0-degree phase, a 90-degree phase, a 180-degree phase, and a 270-degree phase.

A demodulation region 122 may be disposed between a first vertical transmission gate TGA, a second vertical transmission gate TGB, a third vertical transmission gate TGC, and a fourth vertical transmission gate TGD which are spaced apart from one another. The first tap part TAP1 may include a storage gate SG, a tap transmission gate TGX, a recess gate RG, a selection transistor SEL, and a source follower SF which are disposed adjacent to the first vertical transmission gate TGA. A transmission gate insulation layer TGI may be disposed between the first vertical transmission gate TGA and a well region 120 (see FIG. 5). The second to fourth vertical transmission gates TGB, TGC, and TGD, together with a storage gate SG, a tap transmission gate TGX, a recess gate RG, a selection transistor SEL, and a source follower SF which are disposed adjacent thereto, may be included in the second to fourth tap parts TAP2 to TAP4, respectively.

In some example embodiments, the image sensor 100B may have the 4-tap pixel structure, and thus, by performing sensing once, transmission may be performed on all phases of a 0-degree phase, a 90-degree phase, a 180-degree phase, and a 270-degree phase, whereby the image sensor 100B may operate at a high speed. Also, the vertical transmission gates TGA, TGB, TGC, and TGD may be provided relatively long, and an area of the storage gate SG may be provided relatively large. Accordingly, each pixel configuring the image sensor 100B may be miniaturized, and read noise may be minimized.

Figure 18:
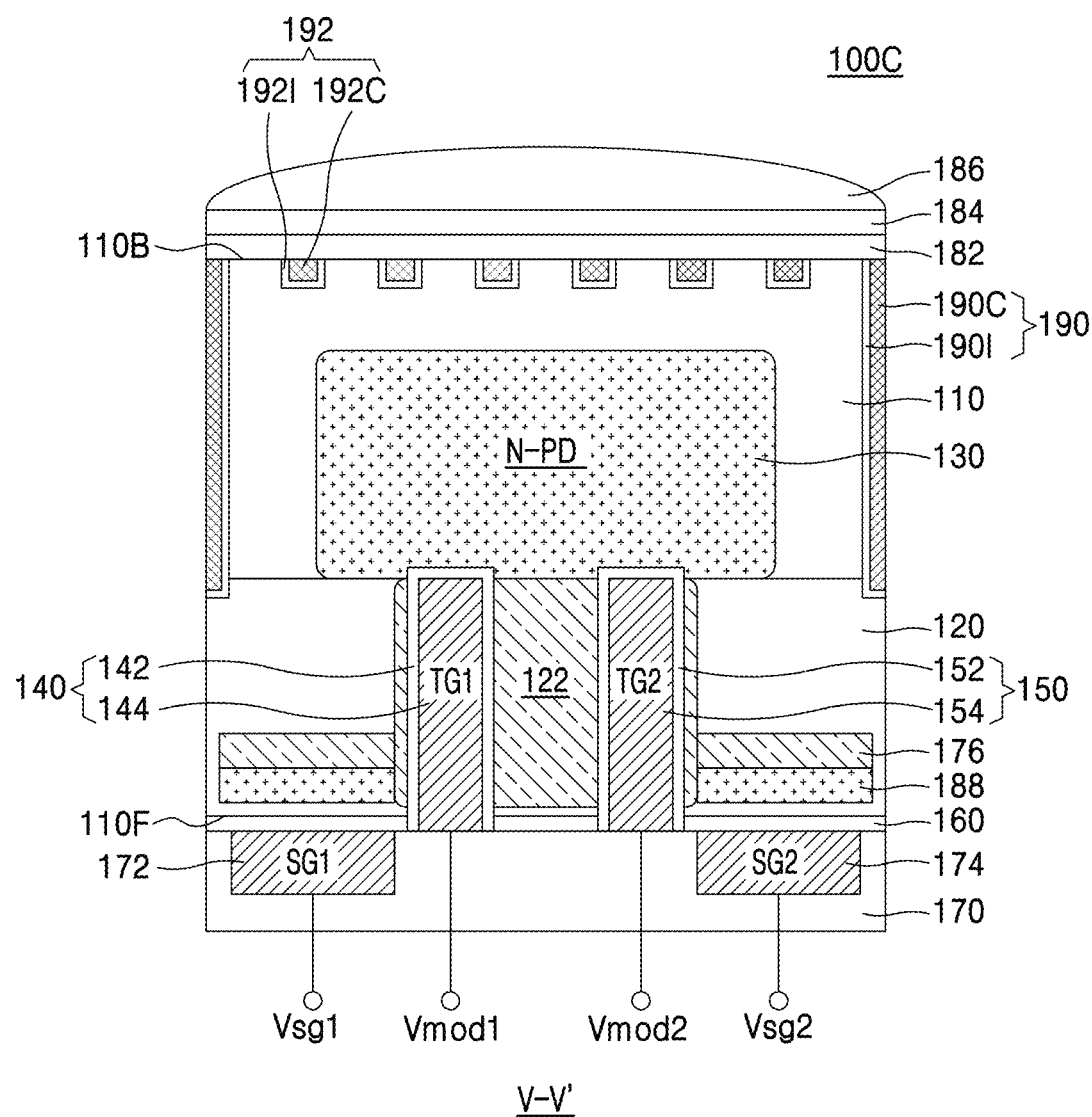
FIG. 18 is a cross-sectional view of a main portion of a unit pixel of an image sensor according to some example embodiments.

FIG. 18 is a cross-sectional view of a main portion of a unit pixel of an image sensor 100C according to some example embodiments.

Referring to FIG. 18, the image sensor 100C may further include a storage diffusion region 188 in an inner portion of the semiconductor substrate 110, such that at least the semiconductor substrate 110 isolates the storage diffusion region 188 from the first and second surface 110F and 110B, and where the storage diffusion region 188 is disposed on (e.g., "under") storage gates SG1 and SG2 and in a region adjacent to a first surface 110F of a semiconductor substrate 110, such that the storage diffusion region 188 is between the first surface 110F and the barrier impurity region 176. As shown in FIG. 18, the barrier impurity region 176 may be in an inner portion of the semiconductor substrate 110, such that at least the semiconductor substrate 110 isolates the storage diffusion region 188 from the first and second surface 110F and 110B. The storage diffusion region 188 may be of ("may be associated with") the second conductivity type. The second conductivity type may be different from the first conductivity type with which the barrier impurity region 176 is associated. For example, the first conductivity type may be a p-type and the second conductivity type may be an n type. For example, as shown in FIG. 18, the storage diffusion region 188 may be disposed to overlap a barrier impurity region 176 in a thickness direction of the semiconductor substrate 110. For example, the storage diffusion region 188 may function as a portion of a storage diode along with the barrier impurity region 176.

For example, the image sensor 100C may read and output a light signal, based on the global shutter manner. In this case, all pixels of the image sensor 100C may be simultaneously reset, light signals may be accumulated, and pixel information may be sequentially read by units of rows. In a case where the storage gates SG1 and SG2 is in a holding process between a light signal accumulating process and a pixel information reading process, there is a problem where an undesired dark current occurs when high voltages Vsg1 and Vsg2 are applied to the storage gates SG1 and SG2. Also, when a low voltage is applied for solving the problem, a charge storage capacity may be reduced. On the other hand, in some example embodiments, the occurrence of a dark current in a holding mode may be prevented by the storage diffusion region 188 under the storage gates SG1 and SG2. Accordingly, regardless of the voltages Vsg1 and Vsg2 applied to the storage gates SG1 and SG2, a full well capacity of the image sensor 100C may be secured.

The image sensor 100C may further include an isolation structure 190 between two adjacent pixels of a plurality of pixels. The isolation structure 190 may extend in a direction from a second surface 110B to the first surface 110F of the semiconductor substrate 110 and may be disposed to surround a photoelectric conversion region 130. For example, the isolation structure 190 may include an insulating material such as oxide, nitride, or oxynitride. In some example embodiments, the isolation structure 190 may include a buried layer 190C and a separation insulation layer 1901 surrounding a sidewall of the buried layer 190C. For example, the buried layer 190C may include polysilicon, a metal, a metal nitride, or an oxide such as $SiO_2$, and the separation isolation layer 1901 may include an oxide, a nitride, an oxynitride, or a combination thereof.

The image sensor 100C may further include a plurality of concave-convex structures 192 which protrude in a direction from the second surface 110B to the inside of the semiconductor substrate 110. Each of the plurality of concave-convex structures 192 may include a scattering inducing layer 192C and an insulation layer 1921 surrounding a sidewall and a bottom surface of the scattering inducing layer 192C. A negative fixed charge layer 182 may be disposed on the second surface 110B to cover the plurality of concave-convex structures 192. For example, the scattering inducing layer 192C may include a dielectric material, an oxide, or a nitride each having a refractive index differing from that of a substrate. In another structure differing from the plurality of concave-convex structures 192 and a method of forming the other structure, the insulation layer 1921 may include the same material as that of the negative fixed charge layer 182, and the insulation layer 1921 and the negative fixed charge layer 182 may be simultaneously formed after forming a trench, and moreover, may be formed by filling the scattering inducing layer 192C.

Figure 19:
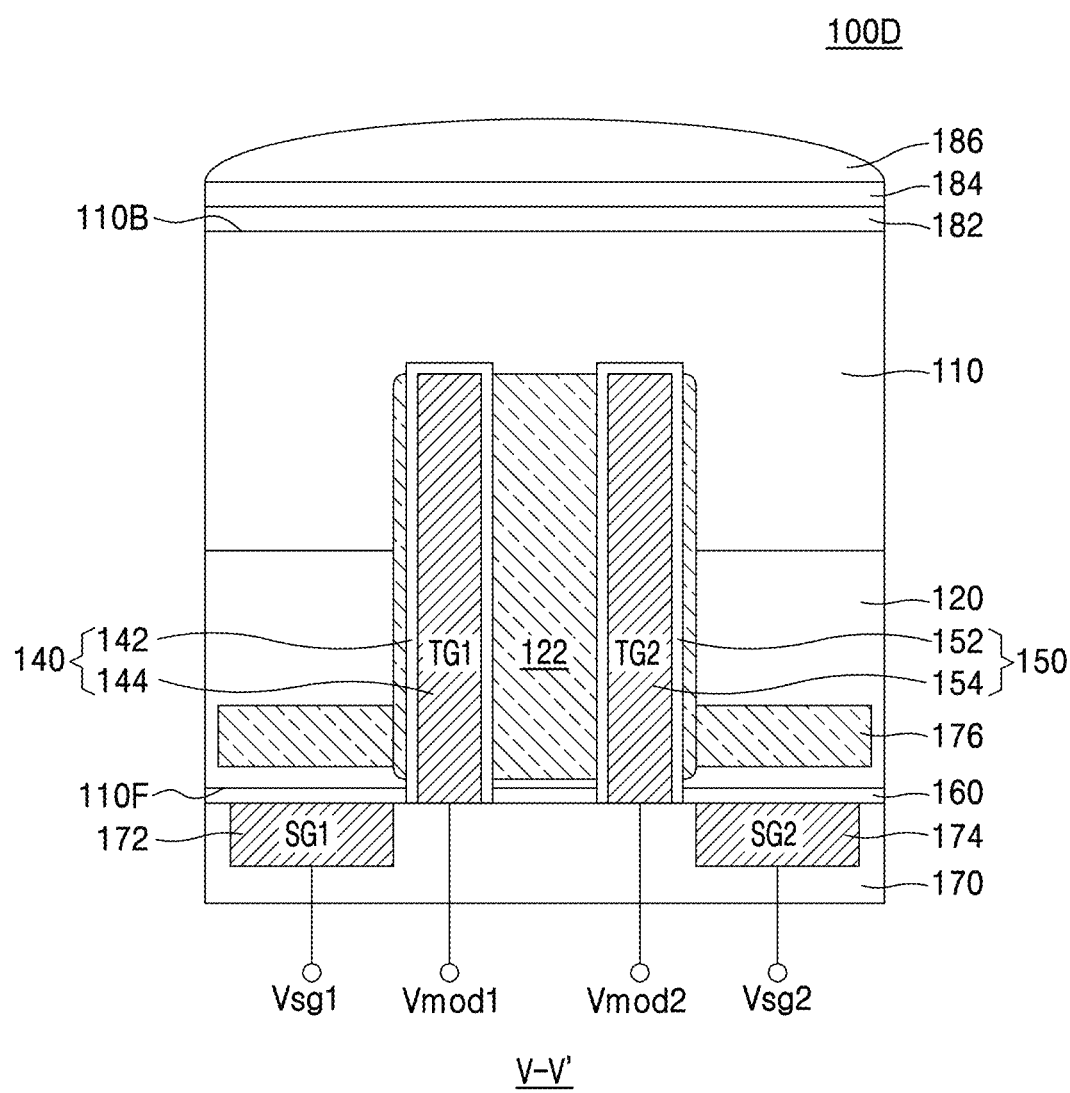
FIG. 19 is a cross-sectional view of a main portion of a unit pixel of an image sensor according to some example embodiments.

FIG. 19 is a cross-sectional view of a main portion of a unit pixel of an image sensor 100D according to some example embodiments.

Referring to FIG. 19, the image sensor 100D may include a first vertical transmission gate (TG1) 144 and a second vertical transmission gate (TG2) 154 which each extend relatively long in a direction from a well region 120 to a second surface 110B of a semiconductor substrate 110. A demodulation region 122 between the first vertical transmission gate (TG1) 144 and the second vertical transmission gate (TG2) 154 may be an impurity region of a p type. The demodulation region 122 may extend in a thickness direction of the semiconductor substrate 110 over a total length of the first vertical transmission gate (TG1) 144 and the second vertical transmission gate (TG2) 154.

In the image sensor 100D according to some example embodiments, the first vertical transmission gate (TG1) 144 and the second vertical transmission gate (TG2) 154 may be provided relatively long, and an area of each of storage gates SG1 and SG2 may be provided relatively large. Accordingly, each pixel configuring the image sensor 100D may be miniaturized, and read noise may be minimized.

Figure 20:
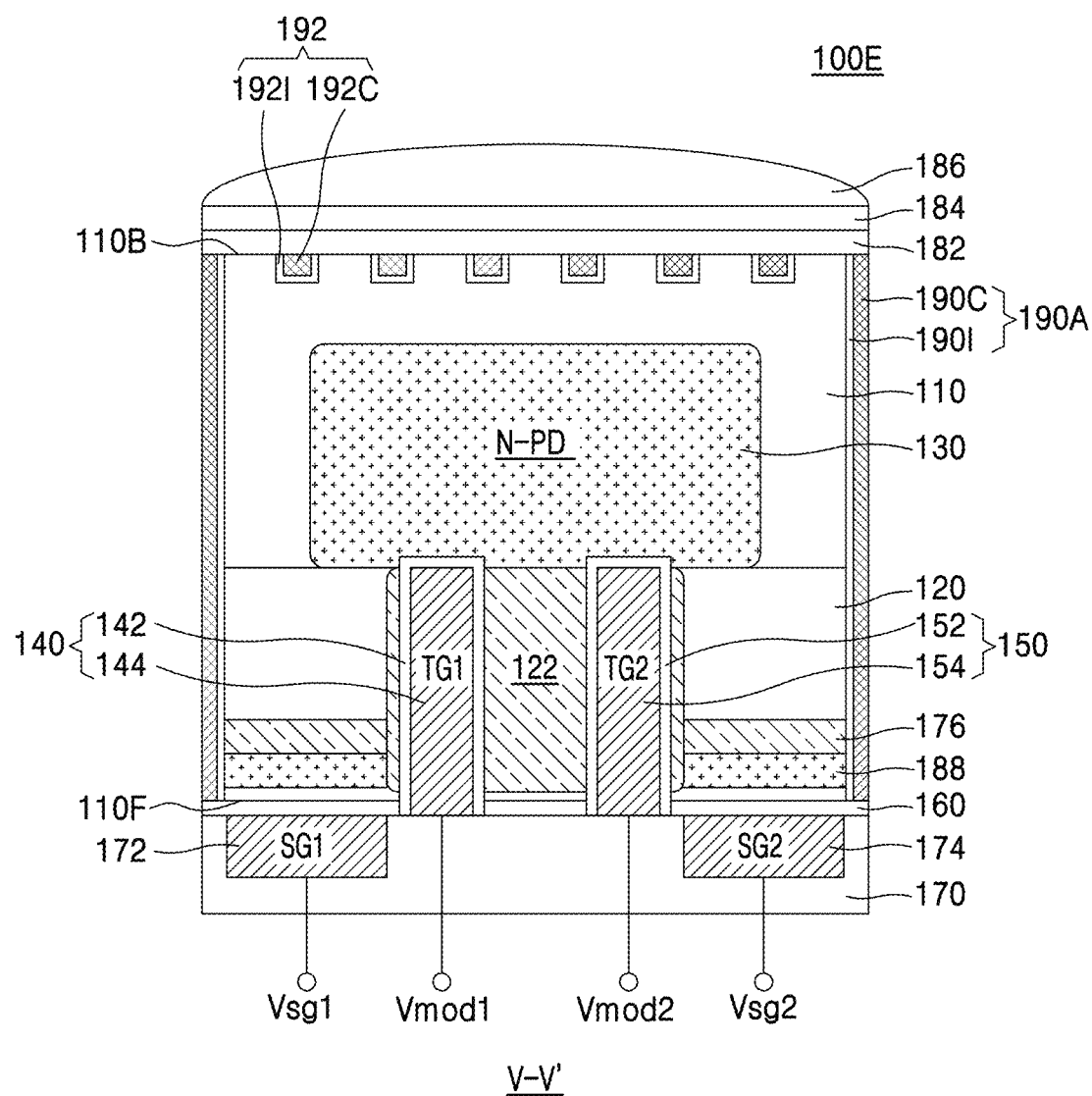
FIG. 20 is a cross-sectional view of a main portion of a unit pixel of an image sensor according to some example embodiments.

FIG. 20 is a cross-sectional view of a main portion of a unit pixel of an image sensor 100E according to some example embodiments.

Referring to FIG. 20, the image sensor 100E may further include an isolation structure 190A between two adjacent pixels of a plurality of pixels. The isolation structure 190A may extend over a total length of a semiconductor substrate 110 in a direction from a first surface 110F to a second surface 110B of the semiconductor substrate 110. The isolation structure 190A may pass through the semiconductor substrate 110 and may electrically and physically separate one pixel from an adjacent pixel. The isolation structure 190A may include a buried layer 190C and a separation insulation layer 1901 surrounding a sidewall of the buried layer 190C. The buried layer 190C and the separation insulation layer 1901 may extend in a direction from the first surface 110F to the second surface 110B of the semiconductor substrate 110. In some example embodiments, the buried layer 190C may include polysilicon, a metal, or a metal nitride, and the separation isolation layer 1901 may include an oxide, a nitride, an oxynitride, or a combination thereof.

The isolation structure 190A may include the buried layer 190C including an insulating material and the separation insulation layer 1901 which surrounds a sidewall of the buried layer 190C and includes a high-k dielectric material.

Figure 21:
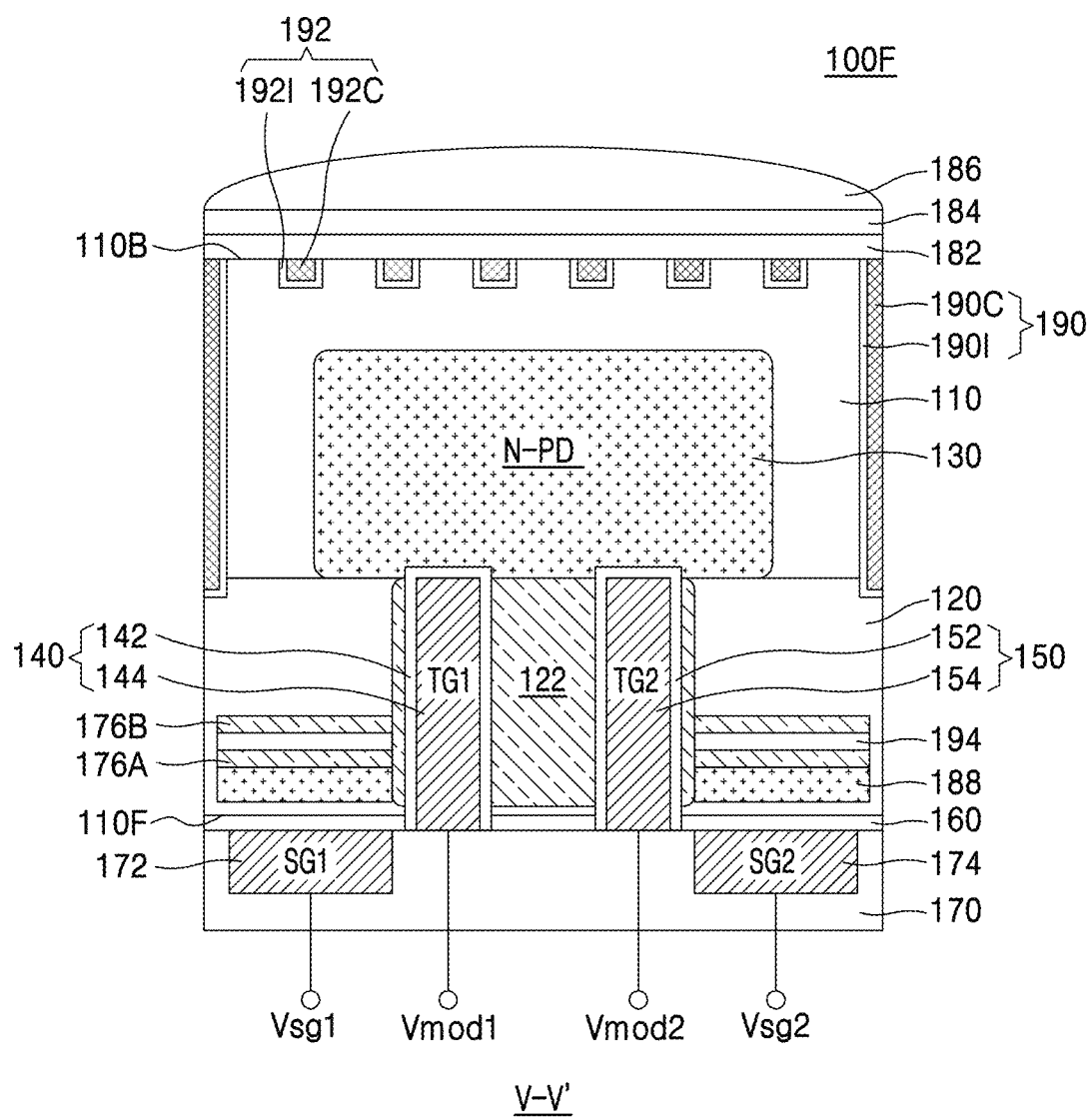
FIG. 21 is a cross-sectional view of a main portion of a unit pixel of an image sensor according to some example embodiments.

FIG. 21 is a cross-sectional view of a main portion of a unit pixel of an image sensor 100F according to some example embodiments.

Referring to FIG. 21, the image sensor 100F may include a first barrier impurity region 176A and a second barrier impurity region 176B which are disposed apart from each other ("isolated from direct contact with each other") in a thickness direction of a semiconductor substrate 110 (e.g., the direction extending perpendicular to at least one of the first surface 110F and the second surface 110B), in the semiconductor substrate 110 under a plurality of storage gates SG1 and SG2. An optical shield region 194 may be disposed between the first barrier impurity region 176A and the second barrier impurity region 176B. For example, the optical shield region 194 may include an insulating material such as silicon oxide. For example, the optical shield region 194 may be a region into which oxygen ions are inserted at a high concentration. The optical shield region 194 may prevent photocharges from occurring in the first barrier impurity region 176A and a storage diffusion region 188 due to undesired external light.

Figure 22:
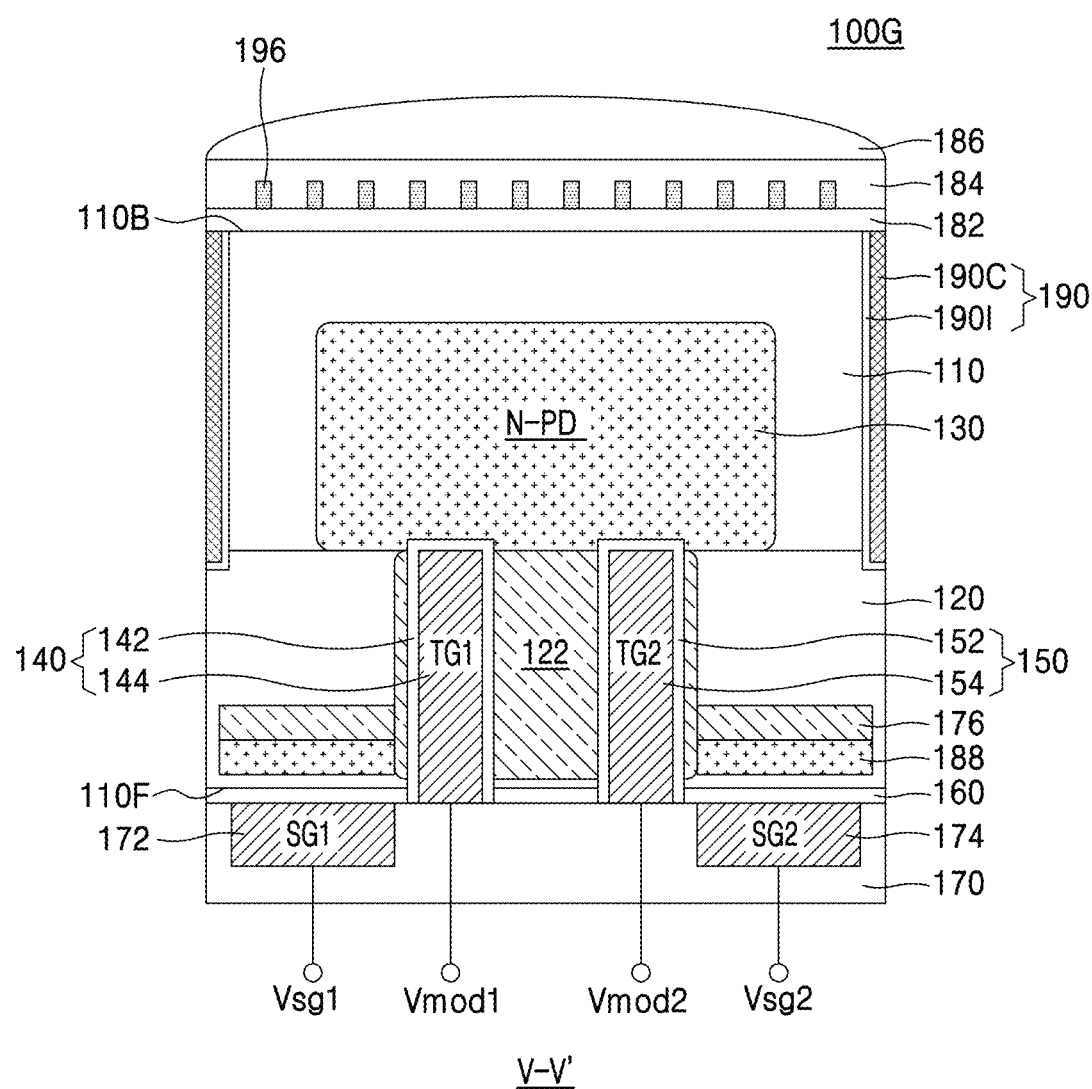
FIG. 22 is a cross-sectional view of a main portion of a unit pixel of an image sensor according to some example embodiments.

FIG. 22 is a cross-sectional view of a main portion of a unit pixel of an image sensor 100G according to some example embodiments.

Referring to FIG. 22, the image sensor 100G may further include a polarization region 196 disposed on a negative fixed charge layer 182. For example, the polarization region 196 may have a 0-degree polarization component, a 45-degree polarization component, a 90-degree polarization component, and a 135-degree polarization component, and the polarization region 196 having the 0, 45, 90, and 135-degree polarization components may be disposed in four pixels arranged at a 2×2 array. Depth information about a target object may be detected by a pixel of the image sensor 100G, and surface shape information about the target object may be further detected by the polarization region 196.

In some example embodiments, the polarization region 196 may include a plurality of concave-convex structures which are repeatedly disposed. For example, the polarization region 196 may include the plurality of concave-convex structures including a metal material or a dielectric material, but is not limited thereto. Although not shown, each of the plurality of concave-convex structures may be provided as a structure which includes a plurality of recesses (not shown) formed by removing a portion of a second surface 110B of the semiconductor substrate 110 and a buried layer (not shown) which is filled into the plurality of recesses and has a refractive index differing from that of the semiconductor substrate 110.

Figure 23:
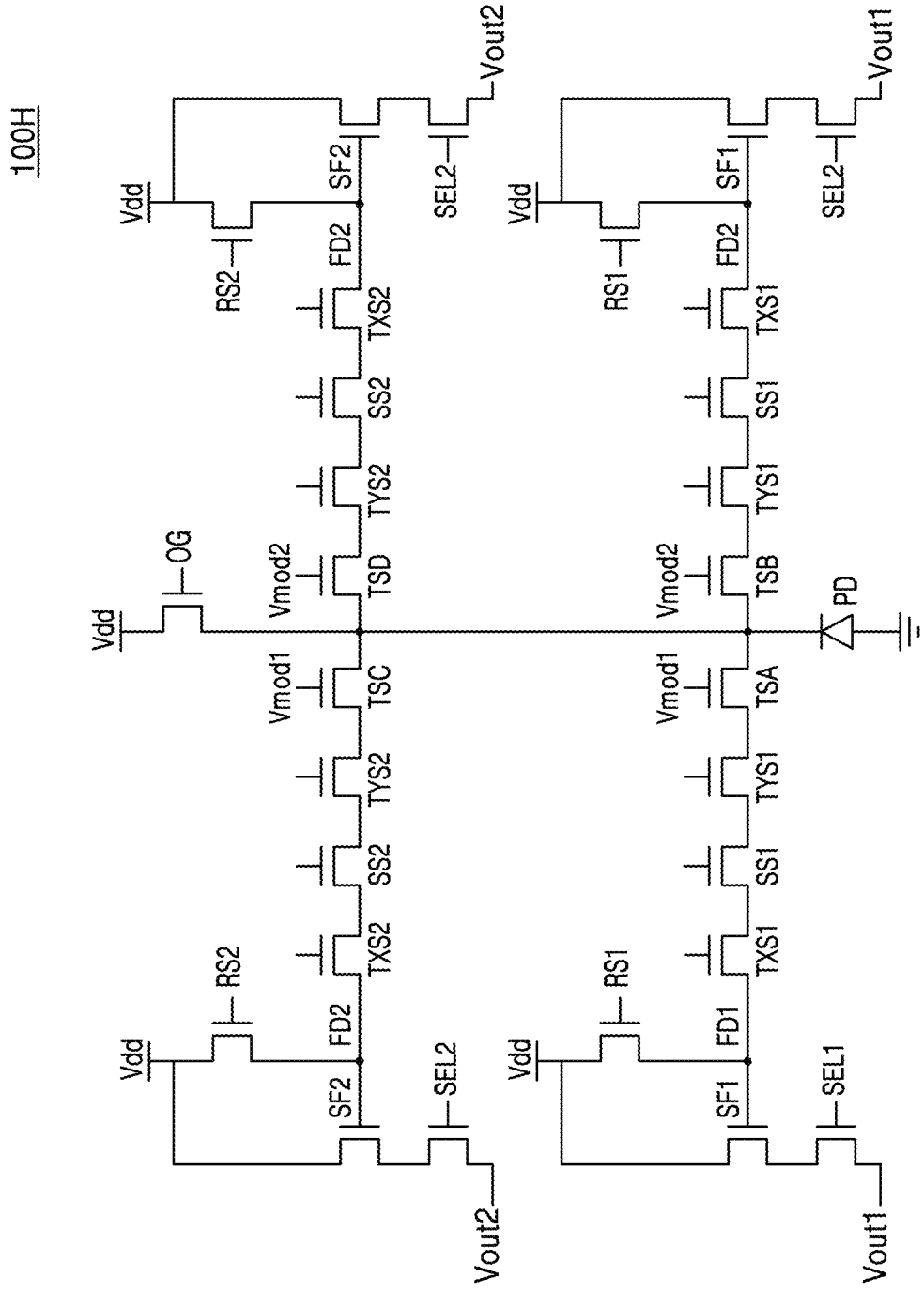
FIG. 23 is an equivalent circuit diagram corresponding to a unit pixel of an image sensor according to some example embodiments.
Figure 24:
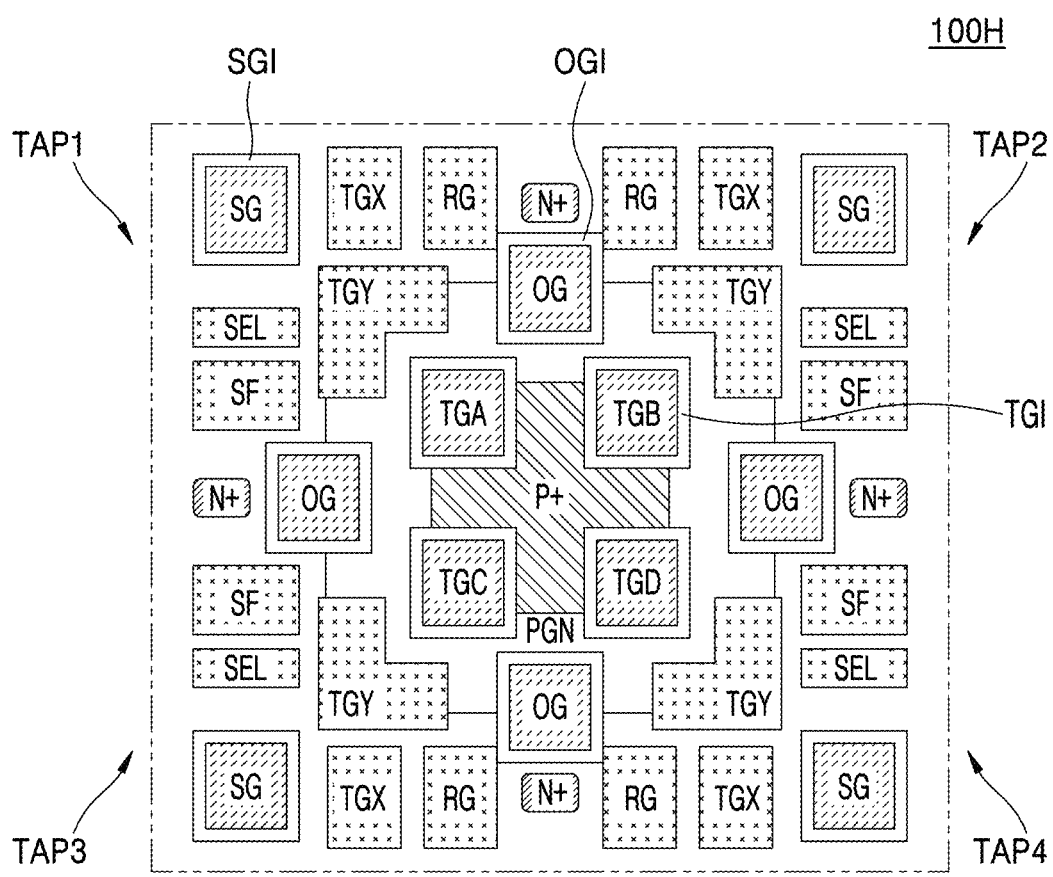
FIG. 24 is a plan view of a main portion of a unit pixel of an image sensor according to some example embodiments.
Figure 25:
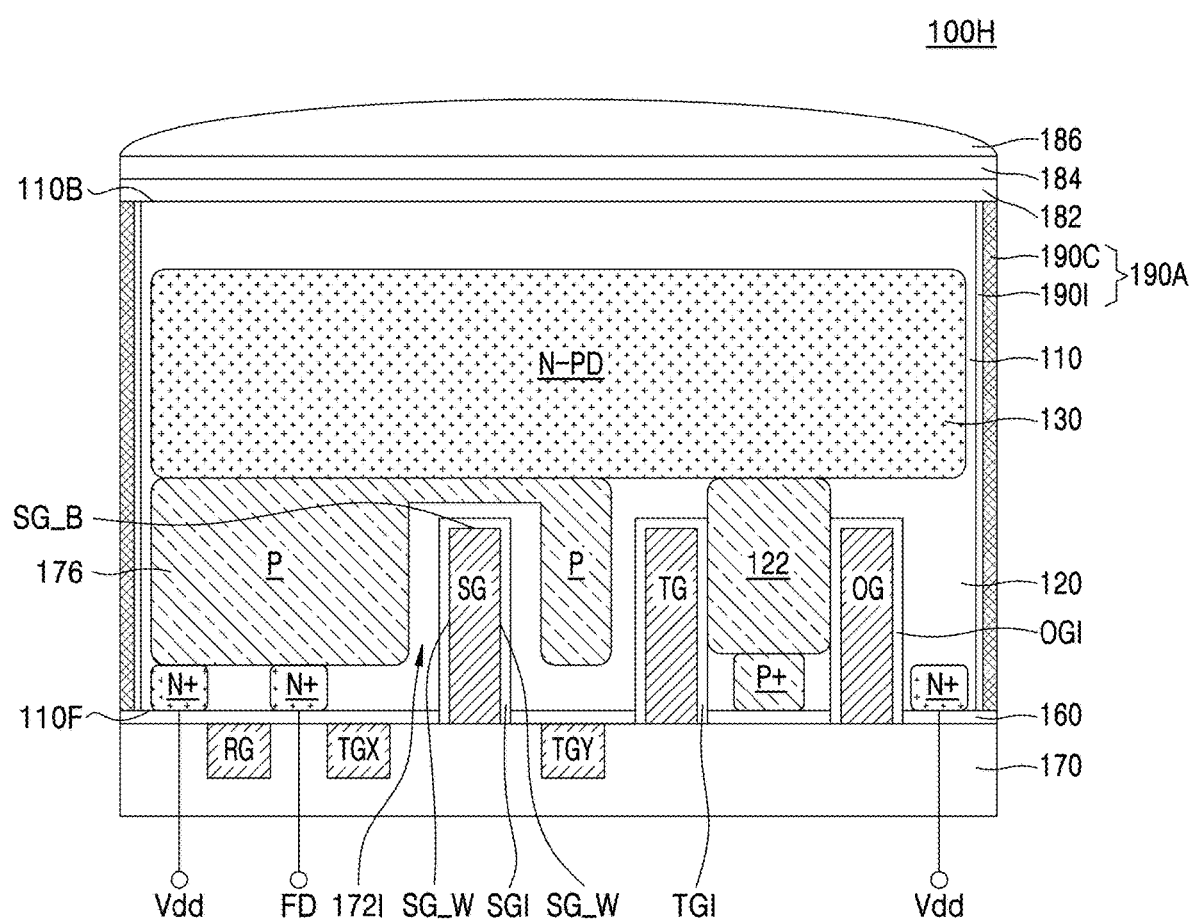
FIG. 25 is a cross-sectional view of a main portion of a unit pixel of an image sensor according to some example embodiments.

FIG. 23 is an equivalent circuit diagram corresponding to a unit pixel of an image sensor 100H according to some example embodiments. FIG. 24 is a plan view of a main portion of a unit pixel of the image sensor 100H according to some example embodiments. FIG. 25 is a cross-sectional view of a main portion of a unit pixel of the image sensor 100H according to some example embodiments.

Referring to FIGS. 23 to 25, the image sensor 100H may have a 4-tap pixel structure. One pixel of the image sensor 100H may include a first tap part TAP1, a second tap part TAP2, a third tap part TAP3, and a fourth tap part TAP4, and by using the first to fourth tap parts TAP1 to TAP4, transmission may be performed based on all phases of a 0-degree phase, a 90-degree phase, a 180-degree phase, and a 270-degree phase.

The image sensor 100H may include at least one vertical transmission gate TG, at least one storage gate SG, and at least one vertical overflow gate OG. In a plan view, first to fourth vertical transmission gates TGA, TGB, TGC, and TGD may be disposed apart from one another with a demodulation region 122 therebetween. For example, a middle tap transmission gate TGY (e.g., a third tap transmission gate) may be disposed adjacent to a sidewall of the first vertical transmission gate TGA opposite to the demodulation region 122, and a vertical storage gate SG (e.g., a first storage gate) may be disposed on one side of the middle tap transmission gate TGY, such that, as shown in at least FIG. 24, the middle tap transmission gate TGY is on the first surface 110F and is between the vertical storage gate SG and the first vertical transmission gate TGA. In another example, a separate middle tap transmission gate TGY (e.g., a fourth tap transmission gate) may be disposed adjacent to a sidewall of the second vertical transmission gate TGB opposite to the demodulation region 122, and a separate vertical storage gate SG (e.g., a second storage gate) may be disposed on one side of the separate middle tap transmission gate TGY, such that, as shown in at least FIG. 24, the separate middle tap transmission gate TGY is on the first surface 110F and is between the separate vertical storage gate SG and the second vertical transmission gate TGB. The vertical storage gates SG (e.g., first and second storage gates) may extend in a direction from a first surface 110F toward a second surface 110B of the semiconductor substrate 110, and a storage gate insulation layer SG1 may surround a sidewall and a bottom surface of the vertical storage gate SG. Restated, and as shown in FIG. 25, a storage gate SG (e.g., first storage gate) may extend in the thickness direction of the semiconductor substrate 110, from the first surface 110F, to extend through at least a portion of the well region 120. Another storage gate SG (e.g., second storage gate) may extend in the thickness direction of the semiconductor substrate 110, from the first surface 110F, to extend through at least a portion of the well region 120.

A barrier impurity region 176 which conforms to a shape of each of the sidewall and the bottom surface of the vertical storage gate SG and is disposed apart from the vertical storage gate SG may be disposed in a well region 120. Restated, and as shown in FIG. 25, the semiconductor substrate 110 may be include a barrier impurity region 176 on a first storage gate (e.g., storage gate SG) and may be isolated from direct contact with the sidewall and bottom surface of the first storage gate (e.g., sidewall SG_W and bottom surface SG_B). A charge storage region 1721 may be disposed in the well region 120 between the barrier impurity region 176 and the vertical storage gate SG. The charge storage region 1721 may be a temporary charge storage region which temporarily stores photocharges generated in the photoelectric conversion region 130 before being transferred to a floating diffusion region FD after being transferred to the demodulation region 122. A tap transmission gate TGX may be disposed between the vertical storage gate SG and the floating diffusion region FD. As illustrated in FIG. 23, a transmission transistor TSA, a middle tap transmission transistor TXS1, a storage transistor SS1, and a tap transmission transistor TYS1 may be sequentially disposed and may extend to the floating diffusion region FD.

A vertical overflow gate OG may be disposed in one side of the demodulation region 122 between the first and second vertical transmission gates TGA and TGB. The vertical overflow gate OG may extend in the direction from the first surface 110F to the second surface 110B of the semiconductor substrate 110, and an overflow gate insulation layer OG1 may surround a sidewall and a bottom surface of the vertical overflow gate OG. The vertical overflow gate OG may be provided to have a length similar to that of the vertical storage gate SG, but is not limited thereto.

The image sensor 100H according to some example embodiments may include the first to fourth vertical transmission gates TGA, TGB, TGC, and TGD, the vertical storage gate SG, and the vertical overflow gate OG, and a length of each of the first to fourth vertical transmission gates TGA, TGB, TGC, and TGD, the vertical storage gate SG, and the vertical overflow gate OG may be relatively long set. Accordingly, each pixel configuring the image sensor 100H may be miniaturized, a charge storage capacity may increase, and read noise may be minimized.

While the inventive concepts have been particularly shown and described with reference to embodiments thereof, it will be understood that various changes in form and details may be made therein without departing from the spirit and scope of the following claims.

What is claimed is:

1. An image sensor, comprising:
a semiconductor substrate including a first surface and a second surface, the semiconductor substrate further including a well region, a separate region, a first floating diffusion region and a second floating diffusion region, each of the well region, the first floating diffusion region and the second floating diffusion region adjacent to the first surface, the separate region being adjacent to the second surface such that the separate region is between the well region and the second surface;
a first vertical transmission gate and a second vertical transmission gate spaced apart from with each other, the first vertical transmission gate and the second vertical transmission gate each extending from the first surface of the semiconductor substrate and in a thickness direction of the semiconductor substrate through at least a portion of the well region, the thickness direction being perpendicular to at least one of the first surface and the second surface;
a photoelectric conversion region in the semiconductor substrate within the separate region and between the well region and the second surface, the photoelectric conversion region overlapping both the first vertical transmission gate and the second vertical transmission gate in the thickness direction of the semiconductor substrate, such that the photoelectric conversion region is spaced apart from the first surface by at least the well region, the first vertical transmission gate, and the second vertical transmission gate;
a first storage gate between the first vertical transmission gate and the first floating diffusion region, the first storage gate on the first surface of the semiconductor substrate; and
a second storage gate between the second vertical transmission gate and the second floating diffusion region, the second storage gate on the first surface of the semiconductor substrate.

2. The image sensor of claim 1, further comprising:
a first tap transmission gate between the first storage gate and the first floating diffusion region, the first tap transmission gate on the first surface of the semiconductor substrate; and
a second tap transmission gate between the second storage gate and the second floating diffusion region, the second tap transmission gate on the first surface of the semiconductor substrate.

3. The image sensor of claim 2, wherein
the first tap transmission gate is a transistor gate of a first tap transmission transistor, and
the first tap transmission transistor is configured to transfer a photocharge that is stored in a first charge storage region on the first storage gate to the first floating diffusion region.

4. The image sensor of claim 1, further comprising:
a gate insulation layer on the first surface of the semiconductor substrate,
wherein
the first storage gate is on the gate insulation layer, and
a bottom surface of the first storage gate is distal to the second surface of the semiconductor substrate in relation to the first surface of the semiconductor substrate.

5. The image sensor of claim 1, wherein a surface area of the first storage gate along a surface parallel to the first surface of the semiconductor substrate is greater than a surface area of the first vertical transmission gate along the surface parallel to the first surface of the semiconductor substrate.

6. The image sensor of claim 1, wherein the semiconductor substrate includes
a demodulation region between the first vertical transmission gate and the second vertical transmission gate in a direction parallel to the first surface of the semiconductor substrate; and
a barrier impurity region on the first storage gate and isolated from direct contact with the first surface of the semiconductor substrate, the barrier impurity region associated with a first conductivity type.

7. The image sensor of claim 6, further comprising:
an overflow gate on the first surface of the semiconductor substrate, the overflow gate connected to one side of the demodulation region.

8. The image sensor of claim 6, wherein the semiconductor substrate further includes a storage diffusion region between the first surface of the semiconductor substrate and the barrier impurity region, the storage diffusion region associated with a second conductivity type, the second conductivity type different from the first conductivity type.

9. The image sensor of claim 6, wherein
the barrier impurity region includes a first barrier impurity region and a second barrier impurity region, the first barrier impurity region and the second barrier impurity region isolated from direct contact with each other in the thickness direction of the semiconductor substrate, and
the image sensor further includes an optical shield region between the first barrier impurity region and the second barrier impurity region.

10. The image sensor of claim 1, wherein the first storage gate extends in the thickness direction of the semiconductor substrate from the first surface of the semiconductor substrate to extend through at least a separate portion of the well region.

11. The image sensor of claim 10, wherein the semiconductor substrate further includes a barrier impurity region on the first storage gate and isolated from direct contact with a sidewall and a bottom surface of the first storage gate, the barrier impurity region associated with a first conductivity type.

12. The image sensor of claim 10, further comprising:
a third tap transmission gate between the first storage gate and the first vertical transmission gate and on the first surface of the semiconductor substrate.

13. An image sensor, comprising:
a semiconductor substrate including a first surface and a second surface, the semiconductor substrate further including a demodulation region;
a first vertical transmission gate and a second vertical transmission gate isolated from direct contact with each other, the demodulation region between the first vertical transmission gate and the second vertical transmission gate, the first vertical transmission gate and the second vertical transmission gate each extending in a thickness direction of the semiconductor substrate from the first surface of the semiconductor substrate, the thickness direction being perpendicular to at least one of the first surface and the second surface; and
a first storage gate and a second storage gate on the first surface of the semiconductor substrate, the first storage gate adjacent to the first vertical transmission gate, the second storage gate adjacent to the second vertical transmission gate, wherein a surface area of the first storage gate along a surface parallel to the first surface of the semiconductor substrate is greater than a surface area of the first vertical transmission gate along the surface parallel to the first surface of the semiconductor substrate, and wherein a surface area of the second storage gate along the surface parallel to the first surface of the semiconductor substrate is greater than a surface area of the second vertical transmission gate along the surface parallel to the first surface of the semiconductor substrate.

14. The image sensor of claim 13, further comprising:
a first tap transmission gate and a second tap transmission gate on the first surface of the semiconductor substrate, the first tap transmission gate adjacent to the first storage gate, the second tap transmission gate adjacent to the second storage gate.

15. The image sensor of claim 14, wherein
the semiconductor substrate further includes a first floating diffusion region and a second floating diffusion region each adjacent to the first surface of the semiconductor substrate,
the first tap transmission gate is between the first floating diffusion region and the first storage gate, and
the second tap transmission gate is between the second floating diffusion region and the second storage gate.

16. The image sensor of claim 13, wherein
the semiconductor substrate further includes a well region, the well region adjacent to the first surface,
the image sensor further includes
    a third tap transmission gate between the first storage gate and the first vertical transmission gate and on the first surface of the semiconductor substrate, and
    a fourth tap transmission gate between the second storage gate and the second vertical transmission gate and on the first surface of the semiconductor substrate, and
the first storage gate and the second storage gate extend in the thickness direction of the semiconductor substrate from the first surface of the semiconductor substrate to extend through at least a portion of the well region.

17. The image sensor of claim 16, wherein the semiconductor substrate further includes a barrier impurity region on the first storage gate and isolated from direct contact with a sidewall and a bottom surface of the first storage gate, the barrier impurity region associated with a first conductivity type.

18. An image sensor, comprising:
a semiconductor substrate including a first surface and a second surface, the semiconductor substrate further including a demodulation region and a first floating diffusion region, the semiconductor substrate associated with a first conductivity type;
a first vertical transmission gate and a second vertical transmission gate isolated from direct contact with each other, the demodulation region between the first vertical transmission gate and the second vertical transmission gate, the first vertical transmission gate and the second vertical transmission gate each extending in a thickness direction of the semiconductor substrate from the first surface of the semiconductor substrate, the thickness direction being perpendicular to at least one of the first surface and the second surface;
a first storage gate between the first vertical transmission gate and the first floating diffusion region, the first storage gate on the first surface of the semiconductor substrate; and
a storage diffusion region in an inner portion of the semiconductor substrate, the storage diffusion region on the first storage gate, the storage diffusion region associated with a second conductivity type, the second conductivity type different from the first conductivity type.

19. The image sensor of claim 18, further comprising:
a barrier impurity region in the inner portion of the semiconductor substrate, the barrier impurity region on the first storage gate, the barrier impurity region associated with the first conductivity type, the barrier impurity region adjacent to the storage diffusion region.

20. The image sensor of claim 19, wherein the barrier impurity region overlaps the first storage gate in the thickness direction of the semiconductor substrate.

* * * * *